United States Patent
Kim et al.

(10) Patent No.: US 9,680,101 B2
(45) Date of Patent: Jun. 13, 2017

(54) COPOLYMER AND ORGANIC SOLAR CELL COMPRISING SAME

(71) Applicant: LG CHEM, LTD., Seoul (KR)

(72) Inventors: Jinseck Kim, Daejeon (KR); Jaechol Lee, Daejeon (KR); Keun Cho, Daejeon (KR); Hangken Lee, Daejeon (KR); Songrim Jang, Daejeon (KR); Doowhan Choi, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/908,979

(22) PCT Filed: Jul. 31, 2014

(86) PCT No.: PCT/KR2014/007033
§ 371 (c)(1),
(2) Date: Jan. 29, 2016

(87) PCT Pub. No.: WO2015/016626
PCT Pub. Date: Feb. 5, 2015

(65) Prior Publication Data
US 2016/0181536 A1 Jun. 23, 2016

(30) Foreign Application Priority Data
Jul. 31, 2013 (KR) .................. 10-2013-0090613

(51) Int. Cl.
*C08G 75/00* (2006.01)
*H01L 51/00* (2006.01)
(Continued)

(52) U.S. Cl.
CPC ........ *H01L 51/0036* (2013.01); *C08G 61/122* (2013.01); *C08G 61/126* (2013.01); *C08G 73/0694* (2013.01); *C08G 75/32* (2013.01); *H01L 31/0256* (2013.01); *H01L 31/042* (2013.01); *C08G 2261/146* (2013.01); *C08G 2261/148* (2013.01);
(Continued)

(58) Field of Classification Search
CPC .... H01L 51/0036; C08G 75/32; C08G 61/126
See application file for complete search history.

(56) References Cited

U.S. PATENT DOCUMENTS

| | | |
|---|---|---|
| 8,921,506 B2 | 12/2014 | Park et al. |
| 2013/0026459 A1 | 1/2013 | Yoshimura et al. |
| 2013/0255780 A1 | 10/2013 | Iwanaga et al. |

FOREIGN PATENT DOCUMENTS

| | | |
|---|---|---|
| EP | 2824158 A1 | 1/2015 |
| JP | 2012-009814 A | 1/2012 |

(Continued)

OTHER PUBLICATIONS

Shao, Shuyan et al., "Enhanced Performance of Inverted Polymer Solar Cells by Using Poly(ethylene oxide)-Modified ZnO as an Electron Transport Layer", ACS Appl. Mater. Interfaces 2013, 5, pp. 380-385, Dec. 28, 2012.

(Continued)

*Primary Examiner* — Shane Fang
(74) *Attorney, Agent, or Firm* — Dentons US LLP

(57) ABSTRACT

The present specification provides a copolymer and an organic solar cell including the same.

14 Claims, 7 Drawing Sheets

(51) Int. Cl.

| | | |
|---|---|---|
| *H01L 31/042* | (2014.01) | |
| *C08G 61/12* | (2006.01) | |
| *C08G 73/06* | (2006.01) | |
| *C08G 75/32* | (2006.01) | |
| *H01L 31/0256* | (2006.01) | |
| *C08K 3/04* | (2006.01) | |
| *H01L 51/42* | (2006.01) | |

(52) U.S. Cl.
CPC ........ *C08G 2261/1424* (2013.01); *C08G 2261/1428* (2013.01); *C08G 2261/3223* (2013.01); *C08G 2261/3241* (2013.01); *C08G 2261/3243* (2013.01); *C08G 2261/3246* (2013.01); *C08G 2261/334* (2013.01); *C08G 2261/344* (2013.01); *C08G 2261/414* (2013.01); *C08G 2261/91* (2013.01); *C08K 3/04* (2013.01); *H01L 51/424* (2013.01); *H01L 51/4253* (2013.01); *H01L 2031/0344* (2013.01)

(56) References Cited

FOREIGN PATENT DOCUMENTS

| | | | | |
|---|---|---|---|---|
| JP | 2012-072398 | A | 4/2012 | |
| JP | 02012072398 | * | 4/2012 | ............ C08G 61/12 |
| JP | 2013-199590 | A | 10/2013 | |
| JP | 2013-203881 | A | 10/2013 | |
| KR | 10-2013-0016131 | A | 2/2013 | |
| KR | 10-2013-0016132 | A | 2/2013 | |
| KR | 2014-0113762 | A | 9/2014 | |
| WO | WO 2012029675 | * | 3/2012 | ............ C08G 61/12 |
| WO | 2012-165128 | A1 | 12/2012 | |

OTHER PUBLICATIONS

Dutta, Pranabesh et al., "Naphtho[1,2-b:5,6-b0]dithiophene-based conjugated polymer as a new electrondonor for bulk heterojunction organic solar cells", Polym. Chem., 2012, 3, pp. 601-604, Jan. 6, 2012.

Charas, Ana et al., "Oxetane-functionalized Conjugated Polymers in Organic (Opto)Electronic Devices", Current Physical Chemistry, 2012, vol. 2, No. 3, pp. 241-264, Aug. 2012.

G. Yu, J. Gao, J. C. Hummelen, F. Wudl, A. J. Heeger, "Efficiencies via Network of Internal Donor-Acceptor Heterojunctions", Science, 270, 1789, (1995).

Oktem, G., et al., "Donor-acceptor type random copolymers for full visible light absorption," Chem. Commun., 2011, vol. 47, No. 13, p. 3933, XP055322102.

Kim, D.H., et al., "Enhanced photocurrent generation by high molecular weight random copolymer consisting of benzothiadiazole and quinoxaline as donor materials," Solar Energy Materials & Solar Cells, 2014, vol. 120, pp. 94-101, XP028775057.

Tsai, Jung-Hsun, et al., "New Thiophene-Phenylene-Thiophene Acceptor Random Conjugated Copolymers for Optoelectronic Applications," Journal of Polymer Science Part A: Polymer Chemistry, 2010, vol. 48, No. 11, pp. 2351-2360, XP055151863.

Sun, W., et al., "An alternating D-A1-D-A2 copolymer containing two electron-deficient moieties for efficient polymer solar cells," J. Mater, Chem. A, 2013, vol. 1, No. 37, pp. 11141-11144, XP055151801.

Kim, H.J., et al., "Optical switching and anion-induced chromogenic application in conjugated polyazomethine derivatives," Reactive & Functional Polymers, 2008, vol. 68, No. 12, pp. 1696-1703, XP025744024.

JP2013-199590—Chemical Abstracts Service, Columbus, Ohio, US; XP002764556. 2013.

* cited by examiner

→ 105
→ 104
→ 103
→ 102
→ 101

COPOLYMER AND ORGANIC SOLAR CELL COMPRISING SAME

TECHNICAL FIELD

The present specification relates to a copolymer and an organic solar cell including the same.

This application is a National Stage Entry of International Application No. PCT/KR2014/007033, filed Jul. 31, 2014, and claims the benefit of Korean Application No. 10-2013-0090613, filed on Jul. 31, 2013, all of which are hereby incorporated by reference in their entirety for all purposes as if fully set forth herein.

BACKGROUND ART

An organic solar cell is a device that may directly convert solar energy into electrical energy by applying a photovoltaic effect. A solar cell may be classified into an inorganic solar cell and an organic solar cell depending on a material constituting a thin film. A typical solar cell is manufactured with a p-n junction obtained by doping crystalline silicon (Si), which is an inorganic semiconductor. Electrons and holes generated due to absorption of light diffuse to a p-n junction point, and are accelerated by an electric field and moved to an electrode. Power conversion efficiency of this procedure is defined as a ratio of power given in an external circuit to solar power fed into the solar cell, and reaches up to 24% when measured under the virtual solar irradiation conditions currently standardized. However, since the inorganic solar cell in the related art already has limits in economic feasibility and available materials, an organic semiconductor solar cell, which is easily processed and cheap and has various functionalities is in the spotlight as a long-term alternative energy source.

In the solar cell, it is important to increase the efficiency such that electrical energy as much as possible may be outputted from the solar energy. In order to increase the efficiency of the solar cell, it is also important to generate excitons as much as possible from inside the semiconductor, but it is also important to take out electric charges generated to the outside without being lost. One of the causes that electric charges are lost is that generated electrons and holes are annihilated by means of recombination. As a method of transferring generated electrons or holes to an electrode without being lost, various methods have been suggested, but most of the methods require additional processes, and as a result, manufacturing costs may be increased.

RELATED ART DOCUMENT

Non-Patent Document

Two-layer Organic Photovoltaic Cell (C. W. Tang, Appl. Phys. Lett., 48, 183. (1996))

Efficiencies via Network of Internal Donor-Acceptor Heterojunctions (G. Yu, J. Gao, J. C. Hummelen, F. Wudl, A. J. Heeger, Science, 270, 1789. (1995))

DETAILED DESCRIPTION OF THE INVENTION

Technical Problem

An object of the present specification is to provide a copolymer and an organic solar cell including the same.

Technical Solution

An exemplary embodiment of the present specification provides a copolymer including: a first monomer represented by the following Formula 1; a second monomer that acts as an electron donor; and a third monomer that acts as an electron acceptor.

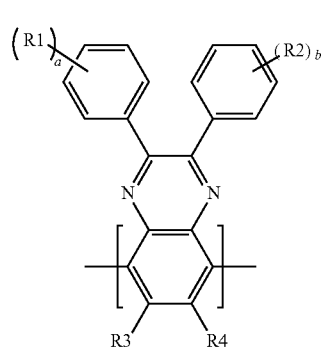

[Formula 1]

In Formula 1, a and b are each an integer of 1 to 5,

R1 is the same or different when a is an integer of 2 to 5,

R2 is the same or different when b is an integer of 2 to 5, and

R1 to R4 are the same as or different from each other, and are each independently selected from the group consisting of hydrogen; deuterium; a halogen group; a nitrile group; a nitro group; an imide group; an amide group; a hydroxyl group; a substituted or unsubstituted carbonyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group.

Another exemplary embodiment of the present specification provides an organic solar cell including: a first electrode; a second electrode provided opposite to the first electrode; and an organic material layer having one or more layers disposed between the first electrode and the second electrode and including a photoactive layer, in which one or more layers of the organic material layer include the copolymer.

Advantageous Effects

The copolymer of the present specification may be used as a material for an organic material layer of an organic solar cell, and the organic solar cell including the same may exhibit excellent characteristics in an increase in an open-circuit voltage and a short-circuit current and/or an increase in efficiency.

The copolymer according to an exemplary embodiment of the present specification has a deep HOMO level, a small bandgap, and a high charge mobility, and thus may exhibit excellent characteristics. The polymer according to an exemplary embodiment of the present specification may be used alone or in a mixture with other materials, enhance efficiency of a device, and enhance life-span characteristics of the device by means of thermal stability of the compound.

EXPLANATION OF REFERENCE NUMERALS AND SYMBOLS

Figure 1:
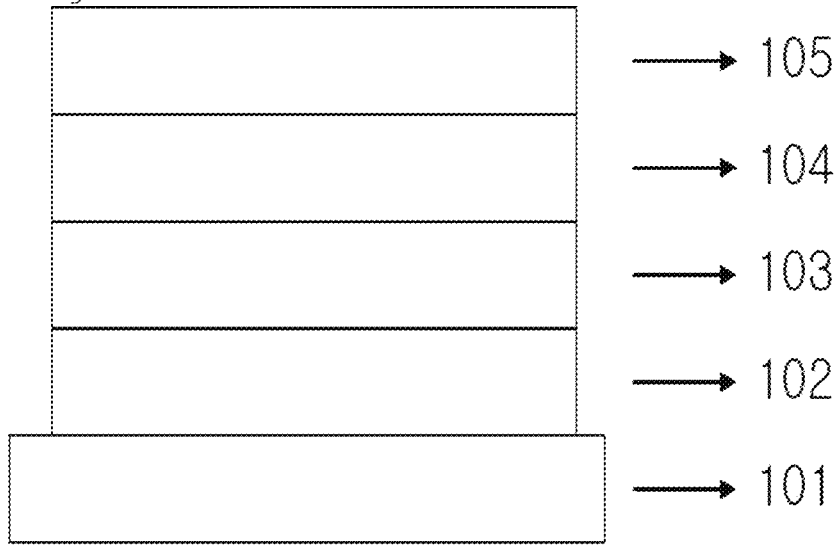
FIG. 1 is a view illustrating an organic solar cell according to an exemplary embodiment of the present specification.

101: Substrate
102: First electrode
103: Hole transport layer
104: Photoactive layer
105: Second electrode

DETAILED DESCRIPTION

Hereinafter, the present specification will be described in detail.
The term 'monomer' as used herein refers to a repeated structure which is included in a main chain of a copolymer, in which the monomer is bonded to the copolymer by means of polymerization.
A copolymer according to an exemplary embodiment of the present specification includes: a first monomer represented by the following Formula 1; a second monomer that acts as an electron donor; and a third monomer that acts as an electron acceptor.
The copolymer according to an exemplary embodiment of the present specification is prepared by three monomers. In this case, the synthesis scheme becomes simple, so that it is easy to synthesize the copolymer.
The copolymer including the three monomers is a random copolymer. In the case of the random copolymer, as the crystallinity is reduced, the degree of amorphousness is increased, so that long-term stability to heat may be secured, and the process of manufacturing a device and a module, which include the copolymer becomes facilitated.
Further, since the ratio of copolymers in a random copolymer is controlled to easily control the solubility, it is easy to provide solubility that is suitable for the process of manufacturing an organic solar cell, thereby manufacturing an organic solar cell with high efficiency.

In an exemplary embodiment of the present invention, R1 and R2 are the same as or different from each other, and are each independently a substituted or unsubstituted alkoxy group; or a substituted or unsubstituted alkyl group.
In an exemplary embodiment of the present invention, R1 and R2 are the same as or different from each other, and are each independently a substituted or unsubstituted alkoxy group having 1 to 30 carbon atoms; or a substituted or unsubstituted alkyl group having 1 to 30 carbon atoms.
In an exemplary embodiment of the present specification, a is 1.
In an exemplary embodiment of the present specification, b is 1.
In an exemplary embodiment of the present specification, R1 and R2 are each substituted in the meta position. In this case, there is an effect of increasing the solubility.
In an exemplary embodiment of the present specification, the first monomer represented by Formula 1 is represented by the following Formula 2.

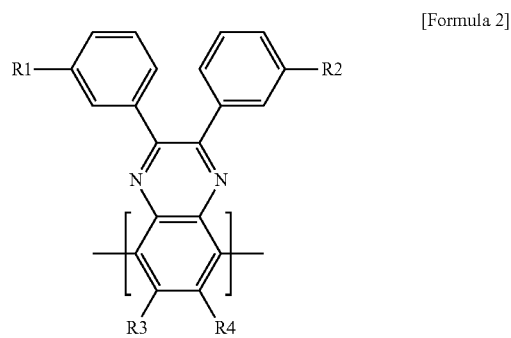

[Formula 2]

In Formula 2,
R1 to R4 are the same as those defined in Formula 1.
In an exemplary embodiment of the present specification, the second monomer that acts as an electron donor includes at least one of the following Formulae.

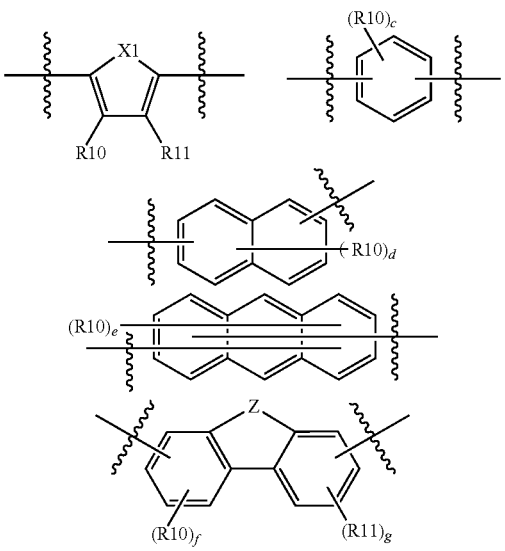

-continued

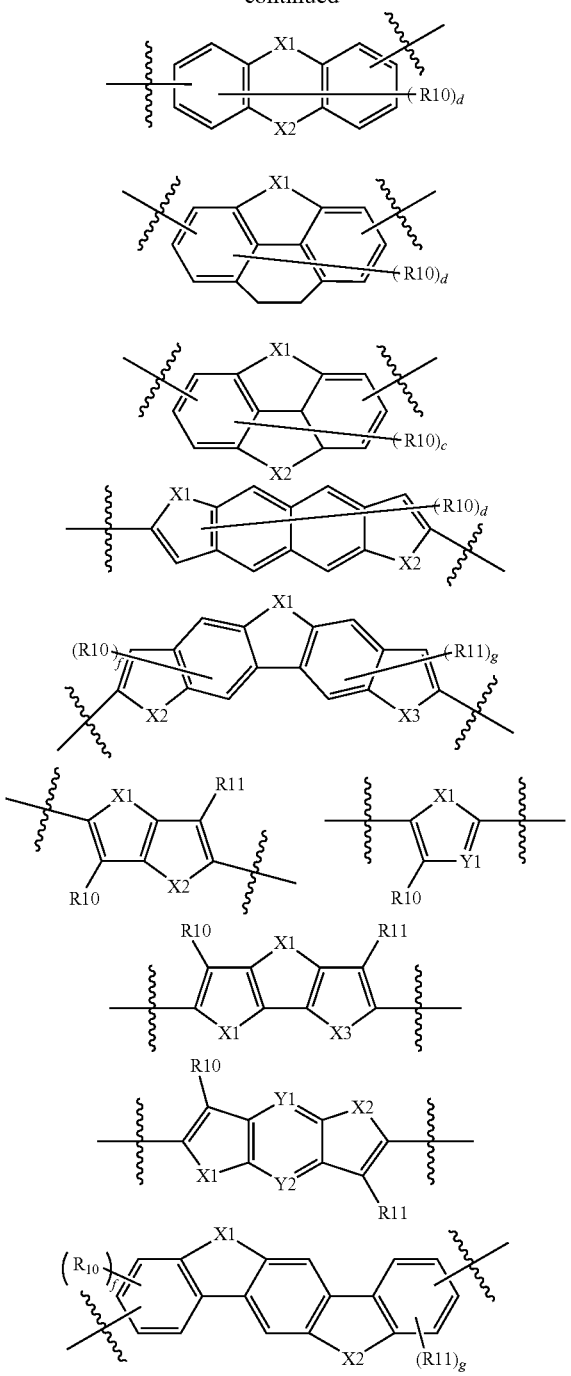

In the Formulae,
c is an integer of 1 to 4,
d is an integer of 1 to 6,
e is an integer in the range of 1 to 8,
f and g are each an integer of 1 to 3,
R10 is the same or different when c, d, e, and f are 2 or more,
R11 is the same or different when g is 2 or more,
polymer R10 and R11 are the same as or different from each other, and are each independently selected from the group consisting of hydrogen; deuterium; a halogen group; a nitrile group; a nitro group; an imide group; an amide group; a hydroxyl group; a substituted or unsubstituted carbonyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group, X1 to X3 are the same as or different from each other, and are each independently selected from the group consisting of CRR', NR, O, SiRR', PR, S, GeRR', Se, and Te, Z is selected from the group consisting of CRR', O, SiRR', PR, S, GeRR', Se, and Te, Y1 and Y2 are the same as or different from each other, and are each independently selected from the group consisting of CR, N, SiR, P, and GeR, and R and R' are the same as or different from each other, and are each independently selected from the group consisting of hydrogen; deuterium; a halogen group; a nitrile group; a nitro group; an imide group; an amide group; a hydroxyl group; a substituted or unsubstituted carbonyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group.

In an exemplary embodiment of the present specification, the third monomer that acts as an electron acceptor includes at least one of the following Formulae.

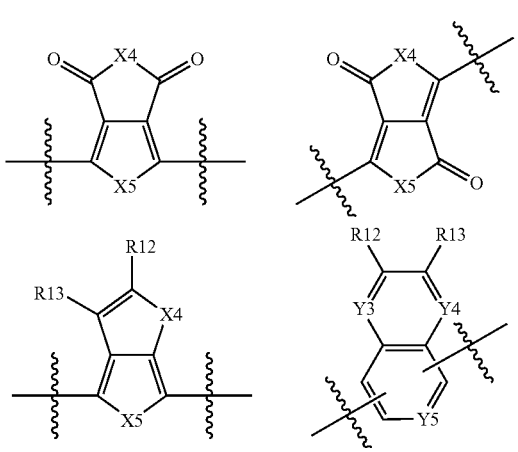

-continued

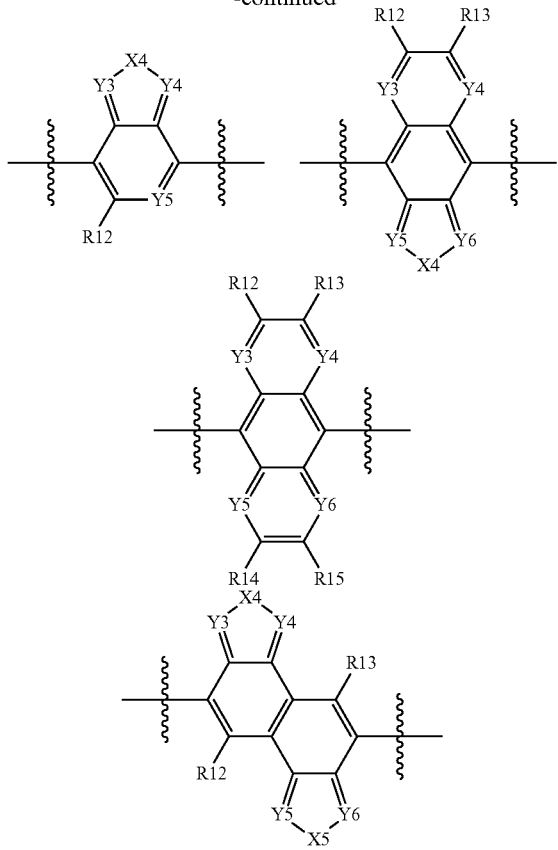

In the Formulae,

R12 to R15 are the same as or different from each other, and are each independently selected from the group consisting of hydrogen; deuterium; a halogen group; a nitrile group; a nitro group; an imide group; an amide group; a hydroxyl group; a substituted or unsubstituted carbonyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group, X4 and X5 are the same as or different from each other, and are each independently selected from the group consisting of CRR', NR, O, SiRR', PR, S, GeRR', Se, and Te, Y3 to Y6 are the same as or different from each other, and are each independently selected from the group consisting of CR, N, SiR, P, and GeR, and R and R' are the same as or different from each other, and are each independently selected from the group consisting of hydrogen; deuterium; a halogen group; a nitrile group; a nitro group; an imide group; an amide group; a hydroxyl group; a substituted or unsubstituted carbonyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group.

Examples of the substituents will be described below, but are not limited thereto.

In the present specification,

means a moiety bonded to the main chain of the copolymer, or a moiety bonded to another substituent.

The term "substituted or unsubstituted" as used herein means being substituted with one or more substituents selected from the group consisting of deuterium; a halogen group; a carbonyl group; an alkyl group; an alkenyl group; an alkoxy group; a cycloalkyl group; a silyl group; an arylalkenyl group; an aryl group; an aryloxy group; an alkylthioxy group; an alkylsulfoxy group; an arylsulfoxy group; a boron group; an alkylamine group; an aralkylamine group; an arylamine group; a heteroaryl group; an arylamine group; an aryl group; a nitrile group; a nitro group; a hydroxyl group; and a heterocyclic group, or having no substituent. For example, "a substituent to which two or more substituents are linked" may be a biphenyl group. That is, the biphenyl group may be an aryl group, and may be interpreted as a substituent to which two phenyl groups are linked. The term means being unsubstituted or substituted with a substituent to which two or more substituents are linked among the substituents exemplified above. For example, "a substituent to which two or more substituents are linked" may be a biphenyl group. That is, the biphenyl group may be an aryl group, and may be interpreted as a substituent to which two phenyl groups are linked.

As used herein, the term "substitution" means that a hydrogen atom bonded to a carbon atom of a compound is changed into another substituent, and the position to be substituted is not limited as long as the position is a position where the hydrogen atom is substituted, that is, a position where the substituent may be substituted, and when two or more are substituted, the two or more substituents may be the same as or different from each other.

In the present specification, the number of carbon atoms of the imide group is not particularly limited, but is preferably 1 to 25. Specifically, the imide group may be one of the compounds having the following structures, but is not limited thereto.

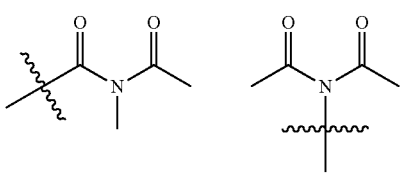

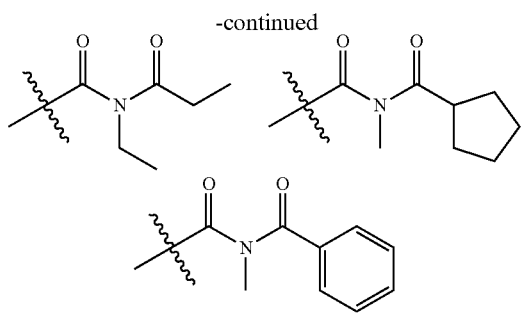

In the present specification, one or two nitrogen atoms of the amide group may be substituted with hydrogen, a straight-chain, branched-chain, or cyclic alkyl group having 1 to 25 carbon atoms, or an aryl group having 6 to 25 carbon atoms. Specifically, the amide group may be one of the compounds having the following Structural Formulae, but is not limited thereto.

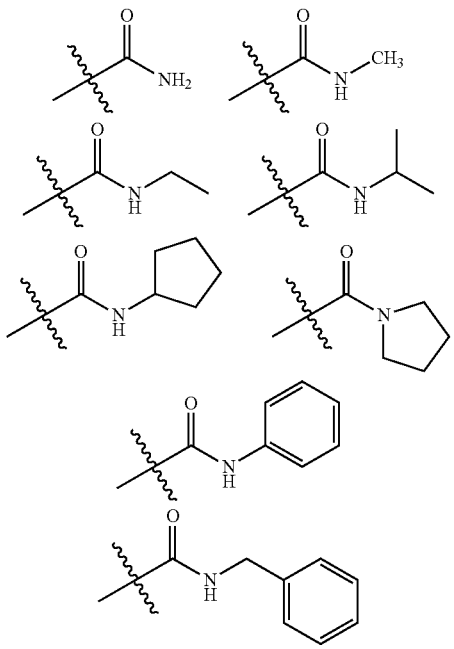

In the present specification, the alkyl group may be a straight-chain or branched-chain, and the number of carbon atoms is not particularly limited, but is preferably 1 to 50. Specific examples thereof include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present specification, the cycloalkyl group is not particularly limited, but is preferably a cycloalkyl group having 3 to 60 carbon atoms, and specific examples thereof include cyclopropyl, cyclobutyl, cyclopentyl, 3-methylcyclopentyl, 2,3-dimethylcyclopentyl, cyclohexyl, 3-methyl-cyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, the alkoxy group may be straight-chain, branched-chain, or cyclic. The number of carbon atoms of the alkoxy group is not particularly limited, but is preferably 1 to 20. Specific examples thereof include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy, and the like, but are not limited thereto.

In the present specification, the alkenyl group may be a straight chain or branched chain, and the number of carbon atoms is not particularly limited, but is preferably 2 to 40. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto. In the present specification, an aryl group may be a monocyclic aryl group or a polycyclic group, and includes the case where an alkyl group having 1 to 25 carbon atoms or an alkoxy group having 1 to 25 carbon atoms is substituted. In addition, the aryl group in the present specification may mean an aromatic ring.

When the aryl group is a monocyclic aryl group, the number of carbon atoms is not particularly limited, but is preferably 6 to 25. Specific examples of the monocyclic aryl group include a phenyl group, a biphenyl group, a terphenyl group, and the like, but are not limited thereto. When the aryl group is a polycyclic aryl group, the number of carbon atoms is not particularly limited, but is preferably 10 to 24. Specific examples of the polycyclic aryl group include a naphthyl group, an anthracenyl group, a phenanthryl group, a pyrenyl group, a perylenyl group, a chrysenyl group, a fluorenyl group, and the like, but are not limited thereto.

In the present specification, the fluorenyl group may be substituted, and adjacent substituents may be combined with each other to form a ring.

When the fluorenyl group is substituted, the fluorenyl group may be

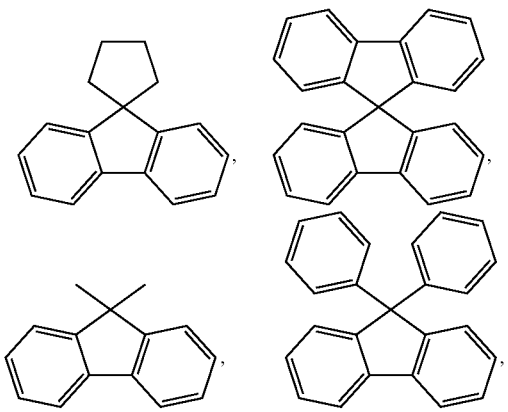

and the like. However, the constitution is not limited thereto.

In the present specification, specific examples of the silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but are not limited thereto. In the present specification, the number of carbon atoms of the amine group is not particularly limited, but is preferably 1 to 30. Specific examples of the amine group include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a phenylnaphthylamine group, a ditolylamine group, a phenyltolylamine group, a triphenylamine group and the like, but are not limited thereto.

In the present specification, examples of the arylamine group include a substituted or unsubstituted monoarylamine group, a substituted or unsubstituted diarylamine group, or a substituted or unsubstituted triarylamine group. An aryl group in the arylamine group may be a monocyclic aryl group, or a polycyclic aryl group. Two or more arylamine groups which the aryl group includes may include a monocyclic aryl group, a polycyclic aryl group, or both a monocyclic aryl group and a polycyclic aryl group.

Specific examples of the arylamine group include a phenylamine group, a naphthylamine group, a biphenylamine group, an anthracenylamine group, a 3-methyl-phenylamine group, a 4-methyl-naphthylamine group, a 2-methyl-biphenylamine group, a 9-methyl-anthracenylamine group, a diphenylamine group, a phenylnaphthylamine group, a ditolylamine group, a phenyltolylamine group, a carbazole group, a triphenylamine group, and the like, but are not limited thereto.

In the present specification, the heterocyclic group includes one or more of an atom other than carbon and a heteroatom, and specifically, the hetero atom may include one or more atoms selected from the group consisting of O, N, Se, S, and the like. The number of carbon atoms of the heterocyclic group is not particularly limited, but is preferably 2 to 60. Examples of the heterocyclic group include a thiophene group, a furan group, a pyrrole group, an imidazole group, a triazole group, an oxazole group, an oxadiazole group, a triazole group, a pyridyl group, a bipyridyl group, a pyrimidyl group, a triazine group, a triazole group, an acridyl group, a pyridazine group, a pyrazinyl group, a quinolinyl group, a quinazoline group, a quinoxalinyl group, a phthalazinyl group, a pyrido-pyrimidinyl group, a pyrido-pyrazinyl group, a pyrazino pyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a benzothiazolyl group, a phenothiazinyl group, a dibenzofuranyl group, and the like, but are not limited thereto.

In the present application, the aryl group in the aryloxy group, the arylthioxy group, the arylsulfoxy group, and the aralkylamine group is the same as the aforementioned examples of the aryl group. Specific examples of the aryloxy group include phenoxy, p-tolyloxy, m-tolyloxy, 3,5-dimethyl-phenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, 9-phenanthryloxy, and the like, examples of the arylthioxy group include a phenylthioxy group, a 2-methylphenylthioxy group, a 4-tert-butylphenylthioxy group, and the like, and examples of the arylsulfoxy group include a benzenesulfoxy group, a p-toluenesulfoxy group, and the like, but are not limited thereto.

In the present specification, the heteroaryl group in the heteroarylamine group may be selected from the aforementioned examples of the heterocyclic group.

In the present specification, the alkyl group in the alkylthioxy group and the alkylsulfoxy group is the same as the aforementioned examples of the alkyl group. Specific examples of the alkylthioxy group include a methylthioxy group, an ethylthioxy group, a tert-butylthioxy group, a hexylthioxy group, an octylthioxy group, and the like, but examples of the alkylsulfoxy group include a methylsulfoxy group, an ethylsulfoxy group, a propylsulfoxy group, a butylsulfoxy group, and the like, but are not limited thereto.

In an exemplary embodiment of the present specification, the copolymer includes a unit represented by the following Formula 1-1.

[Formula 1-1]

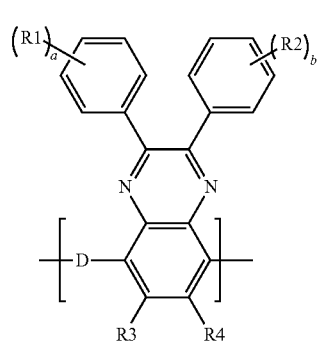

In Formula 1-1,
a, b, and R1 to R4 are the same as those defined in Formula 1, and
D is a second unit that acts as an electron donor.

In an exemplary embodiment of the present specification, the copolymer includes a unit represented by the following Formula 3.

[Formula 3]

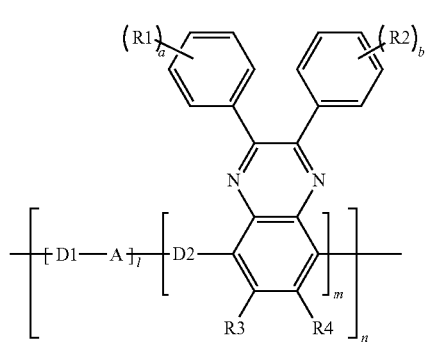

In Formula 3,
a, b, and R1 to R4 are the same as those defined in Formula 1,
l is a real number, which is $0<l\leq1$ as a mole fraction,
m is a real number, which is $0<m\leq1$ as a mole fraction, and
$l+m=1$,
n is an integer of 1 to 10,000,
D1 and D2 are the same as or different from each other, and are each independently a second unit that acts as an electron donor, and
A is a third unit that acts as an electron acceptor.

In an exemplary embodiment of the present specification, examples of the electron donor of D1 and D2 are the same as those described above.

In an exemplary embodiment of the present specification, examples of the electron acceptor of A are the same as those described above.

In an exemplary embodiment of the present specification, D1 includes

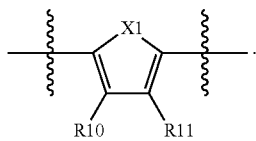

In an exemplary embodiment of the present specification, D1 includes

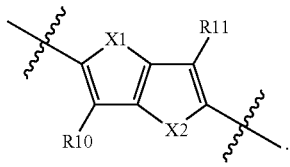

In an exemplary embodiment of the present specification, D2 includes

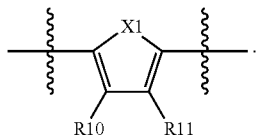

In an exemplary embodiment of the present specification, D2 includes

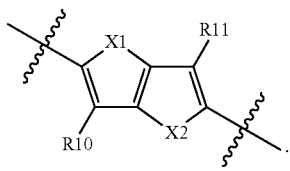

In an exemplary embodiment of the present specification, A includes

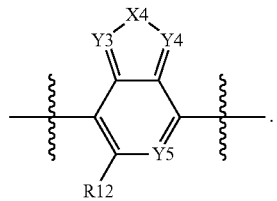

In an exemplary embodiment of the present specification, A includes

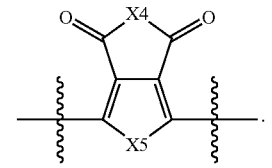

In an exemplary embodiment of the present specification, A includes

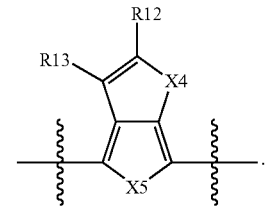

In an exemplary embodiment of the present specification, the copolymer includes at least one of the units represented by the following Formulae 4 to 7.

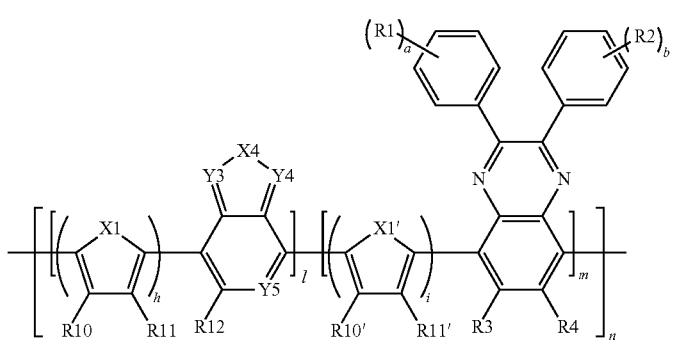

[Formula 4]

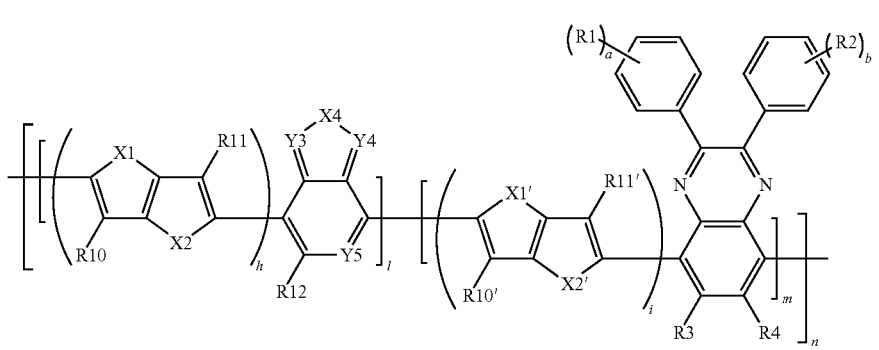

[Formula 5]

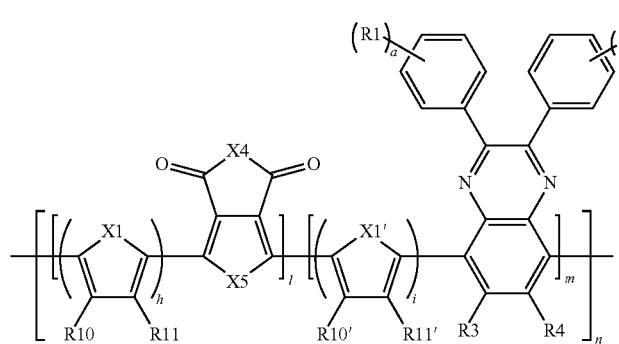

[Formula 6]

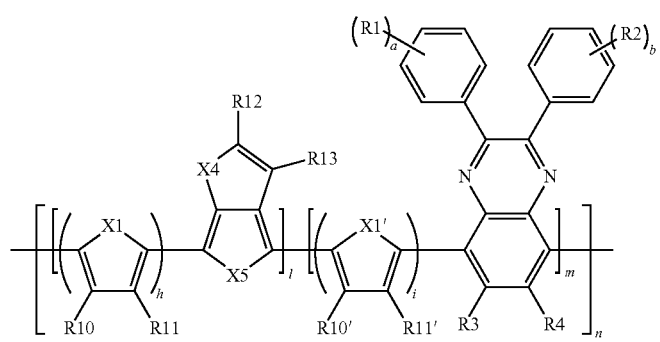

[Formula 7]

In Formulae 4 to 7, a, b, and R1 to R4 are the same as those defined in Formula 1, l is a real number, which is 0<l≤1 as a mole fraction, m is a real number, which is 0<m≤1 as a mole fraction, and l+m=1, h and i are an integer of 1 to 3 as a repeating unit of a structure in the parenthesis, the structures in the parenthesis are the same as or different from each other when h and i are 2 or more, n is an integer of 1 to 10,000, R10 to R13, R10', and R11' are the same as or different from each other, and are each independently selected from the group consisting of hydrogen; deuterium; a halogen group; a nitrile group; a nitro group; an imide group; an amide group; a hydroxyl group; a substituted or unsubstituted carbonyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group, X1, X1', X2, X2', X4, and X5 are the same as or different from each other, and are each independently selected from the group consisting of CRR', NR, O, SiRR', PR, S, GeRR', Se, and Te, Y3 to Y5 are the same as or different from each other, and are each independently selected from the group consisting of CR, N, SiR, P, and GeR, and R and R' are the same as or different from each other, and are each independently selected from the group consisting of hydrogen; deuterium; a halogen group; a nitrile group; a nitro group; an imide group; an amide group; a hydroxyl group; a substituted or unsubstituted carbonyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group.

The 'structure in the parenthesis' as used herein means a structure included in the ( ).

The term 'unit' as used herein means a repeated structure which is included in a monomer of a copolymer, in which the monomer is bonded to the copolymer by means of polymerization.

The term 'including a unit' as used herein means being included in a main chain in the copolymer.

In an exemplary embodiment of the present specification, h is 1.

In an exemplary embodiment of the present specification, h is 2.

In an exemplary embodiment of the present specification, i is 1.

In an exemplary embodiment of the present specification, i is 2.

In an exemplary embodiment of the present specification, X1 is S.

In an exemplary embodiment of the present specification, X1' is S.

In an exemplary embodiment of the present specification, X2 is S.

In an exemplary embodiment of the present specification, X2' is S.

In an exemplary embodiment of the present specification, X4 is S.

In an exemplary embodiment of the present specification, X4 is NR.

In an exemplary embodiment of the present specification, X4 is NR, and R is a substituted or unsubstituted alkyl group.

In an exemplary embodiment of the present specification, X4 is NR, and R is a substituted or unsubstituted dodecanyl group.

In an exemplary embodiment of the present specification, X4 is NR, and R is a dodecanyl group.

In an exemplary embodiment of the present specification, X5 is S.

In an exemplary embodiment of the present specification, Y3 is N.

In an exemplary embodiment of the present specification, Y4 is N.

In an exemplary embodiment of the present specification, Y5 is CR.

In an exemplary embodiment of the present specification, Y5 is CR, and R is a substituted or unsubstituted alkoxy group.

In an exemplary embodiment of the present specification, Y5 is CR, and R is a substituted or unsubstituted octoxy group.

In an exemplary embodiment of the present specification, Y5 is CR, and R is an octoxy group.

In an exemplary embodiment of the present specification, R10 is hydrogen.

In an exemplary embodiment of the present specification, R10' is hydrogen.

In an exemplary embodiment of the present specification, R11 is hydrogen.

In an exemplary embodiment of the present specification, R11' is hydrogen.

In an exemplary embodiment of the present specification, R12 is a substituted or unsubstituted alkoxy group.

In an exemplary embodiment of the present specification, R12 is a substituted or unsubstituted octoxy group.

In an exemplary embodiment of the present specification, R12 is an octoxy group.

In an exemplary embodiment of the present specification, R13 is hydrogen.

In an exemplary embodiment of the present specification, R14 is a substituted or unsubstituted carbonyl group.

In an exemplary embodiment of the present specification, R14 is a carbonyl group substituted with an alkyl group.

In another exemplary embodiment, R14 is 2-ethylhexan-1-one.

In an exemplary embodiment of the present specification, a is 1.

In an exemplary embodiment of the present specification, R1 is substituted at the meta position.

In an exemplary embodiment of the present specification, R1 is a substituted or unsubstituted alkoxy group.

In an exemplary embodiment of the present specification, R1 is a substituted or unsubstituted octoxy group.

In an exemplary embodiment of the present specification, R1 is an octoxy group.

In an exemplary embodiment of the present specification, b is 1.

In an exemplary embodiment of the present specification, R2 is substituted at the meta position.

In an exemplary embodiment of the present specification, R2 is a substituted or unsubstituted alkoxy group.

In an exemplary embodiment of the present specification, R2 is a substituted or unsubstituted octoxy group.

In an exemplary embodiment of the present specification, R2 is an octoxy group.

In an exemplary embodiment of the present specification, R3 is hydrogen.

In another exemplary embodiment, R3 is a halogen group.

In still another exemplary embodiment, R3 is fluorine. In an exemplary embodiment of the present specification, R4 is hydrogen.

In another exemplary embodiment, R4 is a halogen group.

In still another exemplary embodiment, R4 is fluorine.

In an exemplary embodiment of the present specification, the copolymer includes at least one unit of copolymers represented by the following Copolymers 1 to 6.

[Copolymer 1]

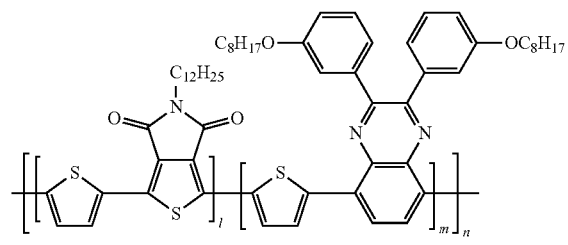

[Copolymer 2]

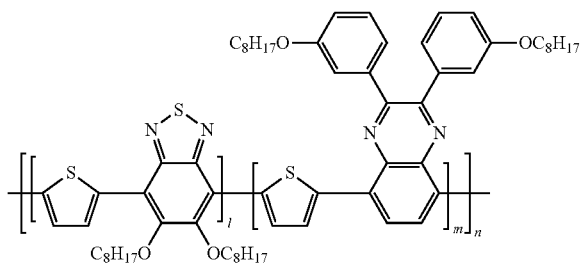

[Copolymer 3]

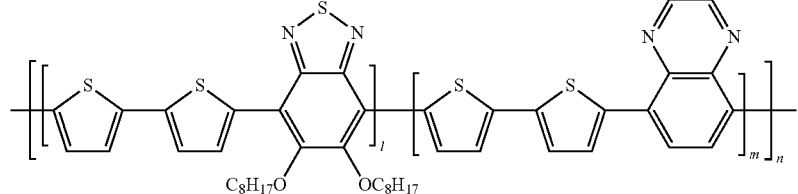

[Copolymer 4]

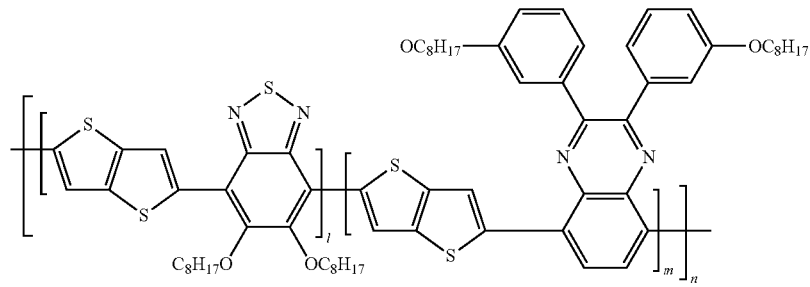

[Copolymer 5]

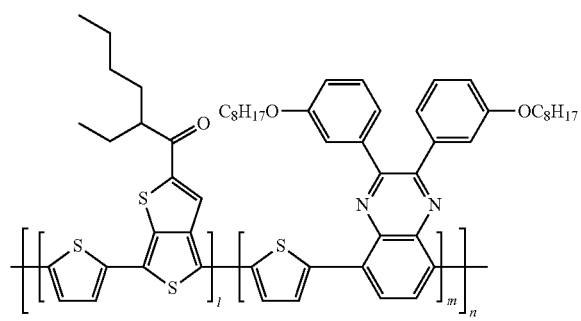

[Copolymer 6]

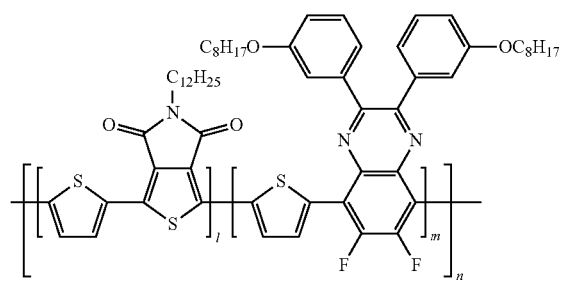

In Copolymers 1 to 6, l, m, and n are the same as those defined above.

In an exemplary embodiment of the present specification, l is 0.5.

In an exemplary embodiment of the present specification, m is 0.5.

In another exemplary embodiment, l is 0.675.

In still another exemplary embodiment, m is 0.325.

In an exemplary embodiment of the present specification, an end group of the copolymer is selected from the group consisting of hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group.

In an exemplary embodiment of the present specification, the end group of the copolymer is a heterocyclic group or an aryl group.

In an exemplary embodiment of the present specification, the end group of the copolymer is a 4-(trifluoromethyl) phenyl group.

According to an exemplary embodiment of the present specification, the number average molecular weight of the copolymer is preferably 500 g/mol to 1,000,000 g/mol. Preferably, the number average molecular weight of the copolymer is preferably 10,000 to 100,000. In an exemplary embodiment of the present specification, the number average molecular weight of the copolymer is 30,000 to 70,000.

According to an exemplary embodiment of the present specification, the copolymer may have a molecular weight distribution of 1 to 100. Preferably, the copolymer has a molecular weight distribution of 1 to 3.

The lower the molecular weight distribution and the larger the number average molecular weight are, the better the electrical properties and the mechanical properties are.

Furthermore, the number average molecular weight is preferably 100,000 or less in order to have a predetermined solubility or more and thus advantageously allow application of a solution application method.

The copolymer may be prepared based on Preparation Examples to be described below.

The copolymer may be prepared by putting a catalyst and a solvent into three monomers and reacting the resulting mixture, precipitating an end capping and the mixture in methanol, and then extracting the solid. As described above, the three monomers may be changed to prepare a copolymer including a unit represented by Formula 3 and a first monomer of Formula 1 as well as Formulae 4 to 6 and Copolymers 1 to 4.

The copolymer according to the present specification may be prepared by a multi-step chemical reaction. Monomers may be prepared by an alkylation reaction, a Grignard reaction, a Suzuki coupling reaction, a Stille coupling reaction, and the like, and then final copolymers may be prepared by a carbon-carbon coupling reaction such as a Stille coupling reaction. When a substituent to be introduced is a boronic acid or boronic ester compound, the copolymer may be prepared by a Suzuki coupling reaction, and when a substituent to be introduced is a tributyltin compound, the copolymer may be prepared by a Stille coupling reaction, but the preparation of the copolymer is not limited thereto.

An exemplary embodiment of the present specification provides an organic solar cell including: a first electrode; a second electrode provided opposite to the first electrode; and an organic material layer having one or more layers disposed between the first electrode and the second electrode and including a photoactive layer, in which one or more layers of the organic material layer include the copolymer.

The organic solar cell according to an exemplary embodiment of the present specification includes a first electrode, a photoactive layer, and a second electrode. The organic solar cell may further include a substrate, a hole transport layer, and/or an electron transport layer.

In an exemplary embodiment of the present specification, when the organic solar cell receives a photon from an external light source, an electron and a hole are generated between an electron donor and an electron acceptor. The generated hole is transported to an anode through an electron donor layer.

In an exemplary embodiment of the present specification, the organic material layer includes a hole transport layer, a hole injection layer, or a layer which transports and injects holes simultaneously, and the hole transport layer, the hole injection layer, or the layer which transports and injects holes simultaneously includes the copolymer.

In another exemplary embodiment, the organic material layer includes an electron injection layer, an electron transport layer, or a layer which injects and transports electrons simultaneously, and the electron injection layer, the electron transport layer, or the layer which injects and transports electrons simultaneously includes the copolymer.

In an exemplary embodiment of the present specification, when the organic solar cell receives a photon from an external light source, an electron and a hole are generated between an electron donor and an electron acceptor. The generated hole is transported to an anode through an electron donor layer.

In an exemplary embodiment of the present specification, the organic solar cell may further include an additional organic material layer. The organic solar cell may use an organic material simultaneously having various functions to decrease the number of organic material layers.

In an exemplary embodiment of the present specification, the first electrode is an anode, and the second electrode is a cathode. In another exemplary embodiment, the first electrode is a cathode, and the second electrode is an anode.

In an exemplary embodiment of the present specification, in the organic solar cell, a cathode, a photoactive layer, and an anode may be disposed in this order, or an anode, a photoactive layer, and a cathode may be disposed in this order, but the sequence is not limited thereto.

In another exemplary embodiment, in the organic solar cell, an anode, a hole transport layer, a photoactive layer, an electron transport layer, and a cathode may be disposed in this order, or a cathode, an electron transport layer, a photoactive layer, a hole transport layer, and an anode may be disposed in this order, but the sequence is not limited thereto.

In an exemplary embodiment of the present specification, the organic solar cell has a normal structure.

In an exemplary embodiment of the present specification, the organic solar cell has an inverted structure.

In another exemplary embodiment, a buffer layer may be provided between the photoactive layer and the hole transport layer, or between the photoactive layer and the electron transport layer. In this case, the hole injection layer may be further provided between the anode and the hole transport layer. Further, an electron injection layer may be further provided between the cathode and the electron transport layer.

In an exemplary embodiment of the present specification, the photoactive layer includes one or two or more selected from the group consisting of an electron donor and an electron acceptor, and the electron donor material includes the copolymer.

In an exemplary embodiment of the present specification, the electron acceptor material may be selected from the group consisting of fullerene, a fullerene derivative, bathocuproine, a semiconductor element, a semiconductor compound, and a combination thereof. Specifically, the electron acceptor material is a compound of one or two or more selected from the group consisting of fullerene, a fullerene derivative (PCBM((6,6)-phenyl-C61-butyric acid-methyl-ester) or PCBCR((6,6)-phenyl-C61-butyric acid-cholesteryl ester), perylene, polybenzimidazole (PBI), and 3,4,9,10-perylene-tetracarboxylic bis-benzimidazole (PTCBI).

In an exemplary embodiment of the present specification, the electron donor and the electron acceptor are a bulk heterojunction (BHJ). The electron donor material and the electron acceptor material are mixed in a ratio (w/w) of 1:10 to 10:1.

The bulk heterojunction means that the electron donor material and the electron acceptor material are mixed with each other in the photoactive layer.

In an exemplary embodiment of the present specification, the photoactive layer has a bilayer structure including an n-type organic material layer and a p-type organic material layer, and the p-type organic material layer includes the copolymer.

The substrate in the present specification may be a glass substrate or a transparent plastic substrate, which has excellent transparency, surface smoothness, easiness in handling, and waterproof, but is not limited thereto, and there is no limitation as long as the substrate is a substrate typically used in the organic solar cell. Specific examples thereof include glass, polyethylene terephthalate (PET), polyethylene naphthalate (PEN), polypropylene (PP), polyimide (PI), triacetyl cellulose (TAC), and the like, but are not limited thereto.

The anode electrode may be a material having transparency and excellent conductivity, but is not limited thereto. Examples of the anode electrode include metal such as vanadium, chromium, copper, zinc and gold, or alloys thereof; metal oxides such as zinc oxide, indium oxide, indium tin oxide (ITO) and indium zinc oxide (IZO); a combination of metal and oxide, such as ZnO:Al or $SnO_2$:Sb; and electrically conductive polymers, such as poly(3-methylthiophene), poly[3,4-(ethylene-1,2-dioxy)thiophene] (PEDT), polypyrrole and polyaniline, and the like, but are not limited thereto.

A method for forming the anode electrode is not particularly limited, but the anode electrode may be formed by being applied on one surface of the substrate or coated in the form of a film by using, for example, sputtering, E-beam, thermal deposition, spin coating, screen printing, inkjet printing, doctor blade or a gravure printing method.

When the anode electrode is formed on a substrate, the formation may be subjected to processes of washing, moisture removal and hydrophilic modification.

For example, when a patterned ITO substrate is sequentially washed with a detergent, acetone, and isopropyl alcohol (IPA), dried on a heating plate at 100° C. to 150° C. for 1 to 30 minutes, preferably at 120° C. for 10 minutes for moisture removal, and is completely washed, the surface of the substrate is hydrophilically modified.

By the surface modification as described above, the junction surface potential may be maintained at a level suitable for the surface potential of the photoactive layer. In addition, during the modification, a polymer thin film may be easily formed, and the quality of the thin film may also be enhanced.

Examples of a pretreatment technology of the anode electrode include a) a surface oxidation method using a parallel plate discharge, b) a method of oxidizing the surface through ozone produced by using UV rays in a vacuum state, c) a method of oxidizing the anode electrode by using an oxygen radical produced by the plasma, and the like.

One of the methods may be selected depending on the state of the anode electrode or the substrate. However, it is commonly preferred that oxygen on the surface of the anode electrode or the substrate is prevented from leaving, and moisture and organic materials are maximally suppressed from remaining even when any of the methods is used. In this case, a substantial effect of the pre-treatment may be maximized.

As a specific example, it is possible to use a method of oxidizing the surface from the ozone produced by using UV. In this case, after being ultrasonically cleaned, the patterned ITO substrate is baked and well dried on a hot plate, and introduced into a chamber, and then may be cleaned by the ozone produced by actuating a UV lamp to react an oxygen gas with the UV rays.

However, the method of modifying the surface of the patterned ITO substrate in the present specification need not be particularly limited, and any method may also be used as long as the method is a method of oxidizing the substrate.

The cathode electrode may be a metal having a small work function, but is not limited thereto. Specific examples thereof include metal such as magnesium, calcium, sodium, potassium, titanium, indium, yttrium, lithium, gadolinium, aluminum, silver, tin, and lead, or an alloy thereof; and a material having a multilayered structure, such as LiF/Al, LiO$_2$/Al, LiF/Fe, Al:Li, Al:BaF$_2$, and Al:BaF$_2$:Ba, but are not limited thereto.

The cathode electrode may be deposited and formed inside a thermal deposition device allowing a degree of vacuum of 5×10$^{-7}$ torr or less, but is not limited to the method.

The hole transport layer and/or electron transport layer materials serve to efficiently transfer electrons and holes separated from the photoactive layer to the electrode, and the material is not particularly limited.

The hole transport layer material may be PEDOT:PSS (Poly(3,4-ethylenediocythiophene) doped with poly(styrenesulfonic acid)), molybdenum oxide (MoO$_x$); vanadium oxide (V$_2$O$_5$); nickel oxide (NiO); and tungsten oxide (WO$_x$), and the like, but is not limited thereto.

The electron transport layer material may be electron-extracting metal oxides, and may be specifically a metal complex of 8-hydroxyquinoline; a complex including Alq$_3$; a metal complex including Liq; LiF; Ca; titanium oxide (TiO$_x$); zinc oxide (ZnO); cesium carbonate (Cs$_2$CO$_3$), and the like, but is not limited thereto.

The photoactive layer may be formed by dissolving a photoactive material such as an electron donor and/or an electron acceptor in an organic solvent, and then coating the resulting solution by a method such as spin coating, dip coating, screen printing, spray coating, doctor blade and brush painting, but the method is not limited thereto.

The preparation method of the copolymer and the manufacture of an organic solar cell including the same will be specifically described in the following Preparation Examples and Examples. However, the following Examples are provided to illustrate the present specification, but the scope of the present specification is not limited thereby.

Example 1. Polymerization of Polymer (Polymerization of Copolymer 1)

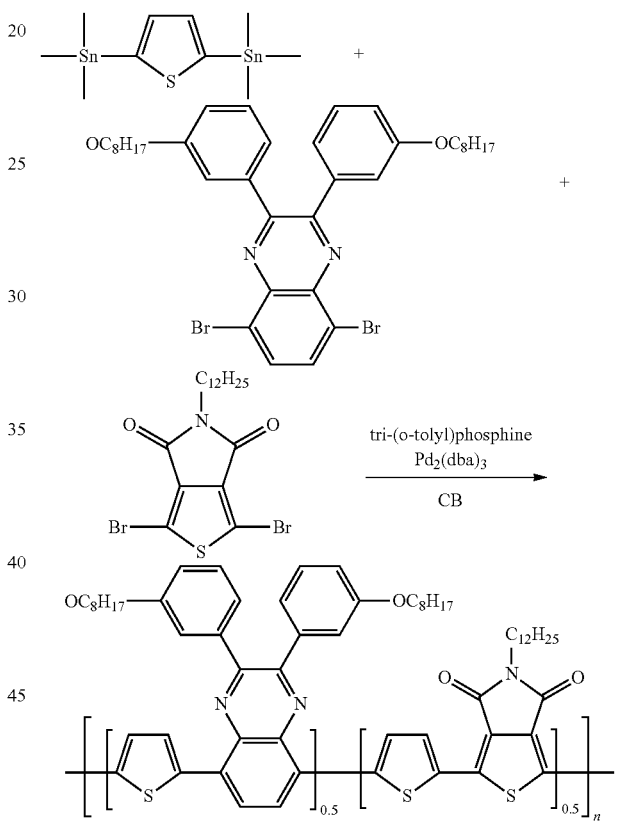

13 ml of chlorobenzene, 1.2 g (2.93 mmol) of 2,5-bis(trimethylstannyl)thiophene, 1.020 g (1.464 mmol) of 5,8-dibromo-2,3-bis(3-(octyloxy)phenyl)quinoxaline, 0.7018 g (1.464 mmol) of 1,3-dibromo-5-dodecylthieno[3,4-c]pyrrole-4,6-dione, 80 mg of Pd$_2$(dba)$_3$ (tris(dibenzylideneacetone)dipalladium(0)), and 106 mg of tri-(o-tolyl)phosphine were put into a microwave reactor vial, and reacted under the condition of 170° C. for 1 hour. After the mixture was cooled to room temperature and poured into methanol, the solid was filtered and subjected to Soxhlet extraction in methanol, acetone, hexane, and chloroform, and then the chloroform portion was again precipitated in methanol to filter the solid.

Figure 2:
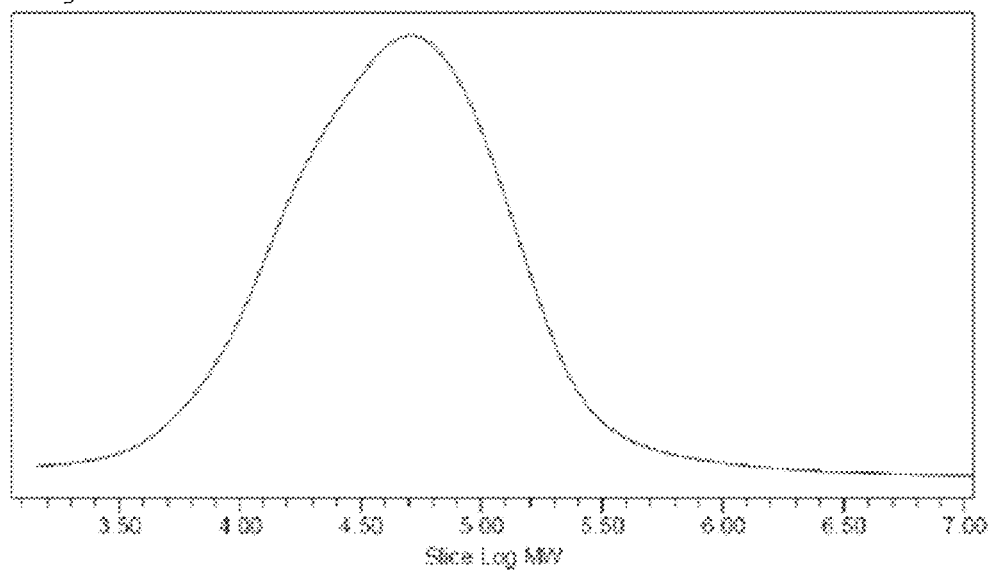
FIG. 2 is a view illustrating a gel permeation chromatography (GPC) of Copolymer 1 prepared in Example 1.

Yield: 46%
Number average molecular weight: 24,600 g/mol
Weight average molecular weight: 90,000 g/mol FIG. 2 is a view illustrating a gel permeation chromatography (GPC) of Copolymer 1 prepared in Example 1.

Example 2. Polymerization of Polymer (Polymerization of Copolymer 2)

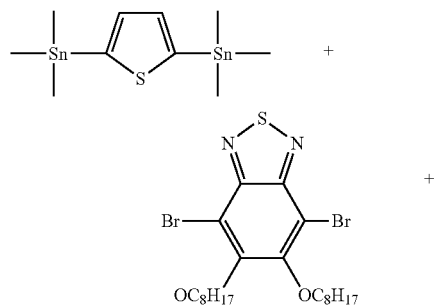

15 ml of chlorobenzene, 1.0 g (2.440 mmol) of 2,5-bis(trimethylstannyl)thiophene, 0.6716 g (1.220 mmol) of 4,7-dibromo-5,6-bis (octyloxy)benzo[c]-1,2,5-thiadiazole, 0.8500 g (1.220 mmol) of 5,8-dibromo-2,3-bis(3-(octyloxy)phenyl)quinoxaline, 67 mg of $Pd_2(dba)_3$ (tris(dibenzylideneacetone)dipalladium(0)), and 89 mg of tri-(o-tolyl)phosphine were put into a microwave reactor vial, and reacted under the condition of 170° C. for 1 hour. After the mixture was cooled to room temperature and poured into methanol, the solid was filtered and subjected to Soxhlet extraction in methanol, acetone, hexane, and chloroform, and then the chloroform portion was again precipitated in methanol to filter the solid.

Yield: 46%

Number average molecular weight: 18,800 g/mol

Weight average molecular weight: 40,100 g/mol

Figure 3:
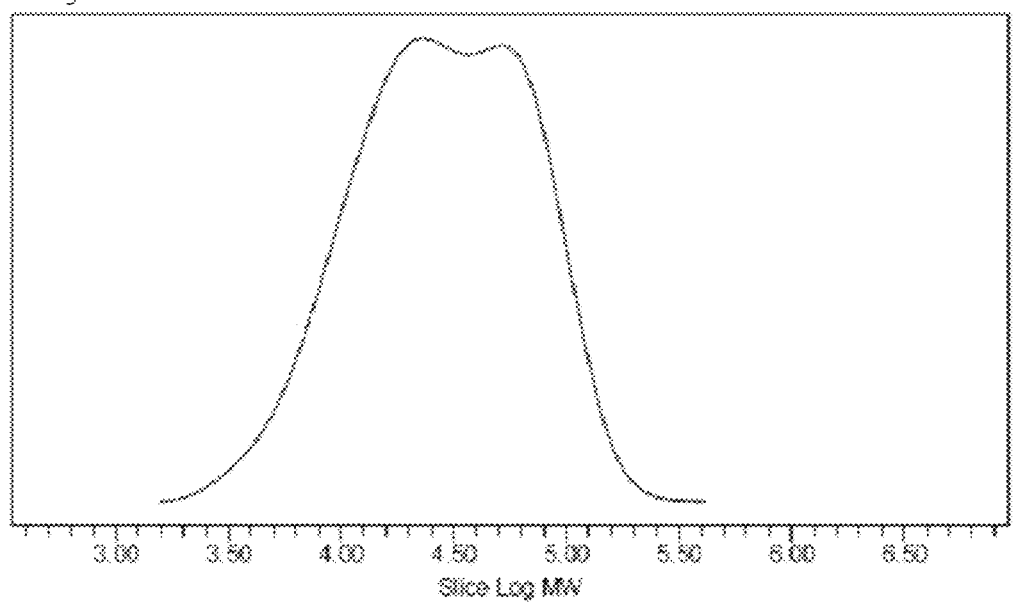
FIG. 3 is a view illustrating a gel permeation chromatography (GPC) of Copolymer 2 prepared in Example 2.

FIG. 3 is a view illustrating a gel permeation chromatography (GPC) of Copolymer 2 prepared in Example 2.

Example 3. Polymerization of Polymer (Polymerization of Copolymer 3)

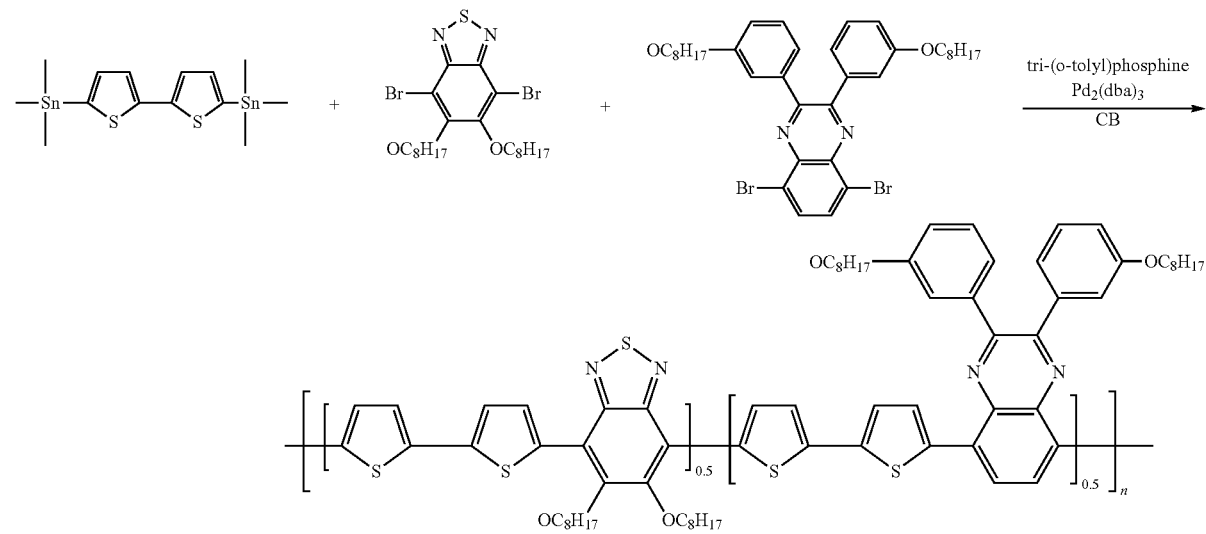

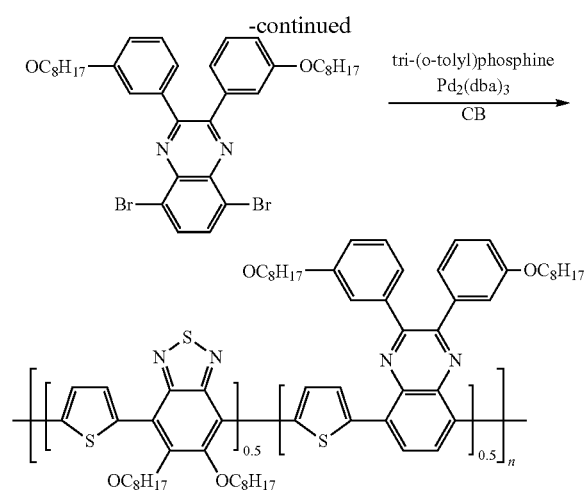

15 ml of chlorobenzene, 0.9724 g (1.976 mmol) of 5,5'-bis(trimethylstannyl)-2,2'-bithiophene, 0.5440 g (0.988 mmol) of 4,7-dibromo-5,6-bis (octyloxy)benzo[c]-1,2,5-thiadiazole, 0.6885 g (0.988 mmol) of 5,8-dibromo-2,3-bis(3-(octyloxy)phenyl)quinoxaline, 54 mg of $Pd_2(dba)_3$ (tris (dibenzylideneacetone)dipalladium(0)), and 72 mg of tri-(o-tolyl)phosphine were put into a microwave reactor vial, and reacted under the condition of 170° C. for 1 hour. After the mixture was cooled to room temperature and poured into methanol, the solid was filtered and subjected to Soxhlet extraction in methanol, acetone, hexane, and chloroform, and then the chloroform portion was again precipitated in methanol to filter the solid.

Yield: 52%

Number average molecular weight: 25,700 g/mol

Weight average molecular weight: 120,000 g/mol

Figure 4:
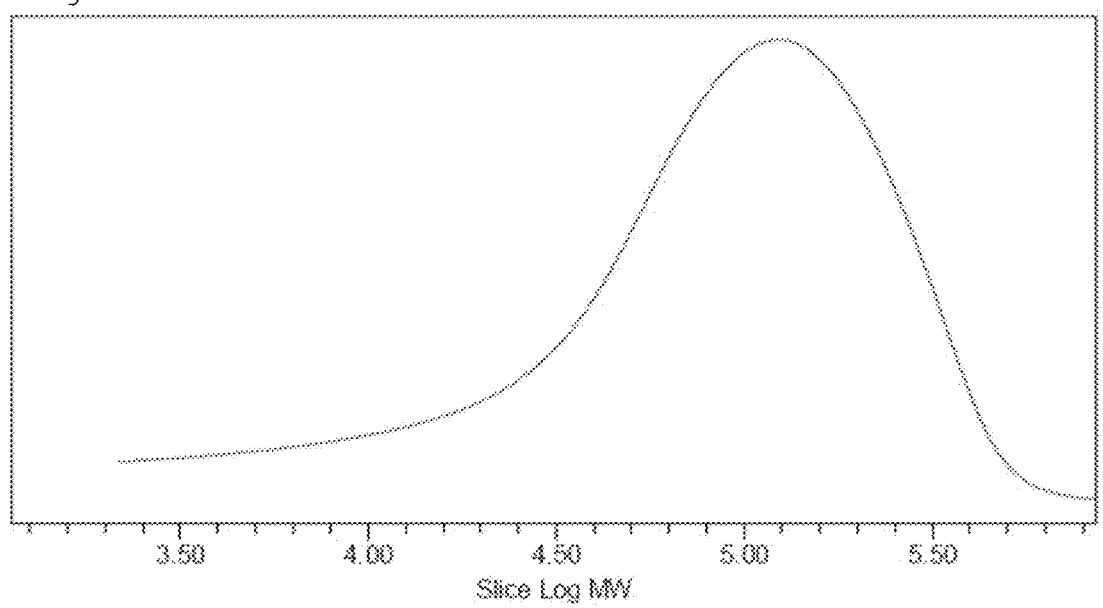
FIG. 4 is a view illustrating a gel permeation chromatography (GPC) of Copolymer 3 prepared in Example 3.

FIG. 4 is a view illustrating a gel permeation chromatography (GPC) of Copolymer 3 prepared in Example 3.

Example 4. Polymerization of Polymer (Polymerization of Copolymer 4)

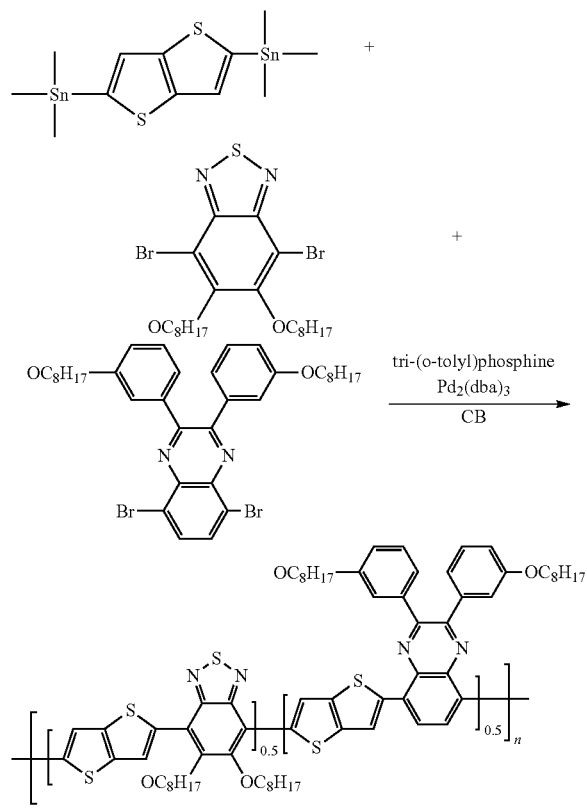

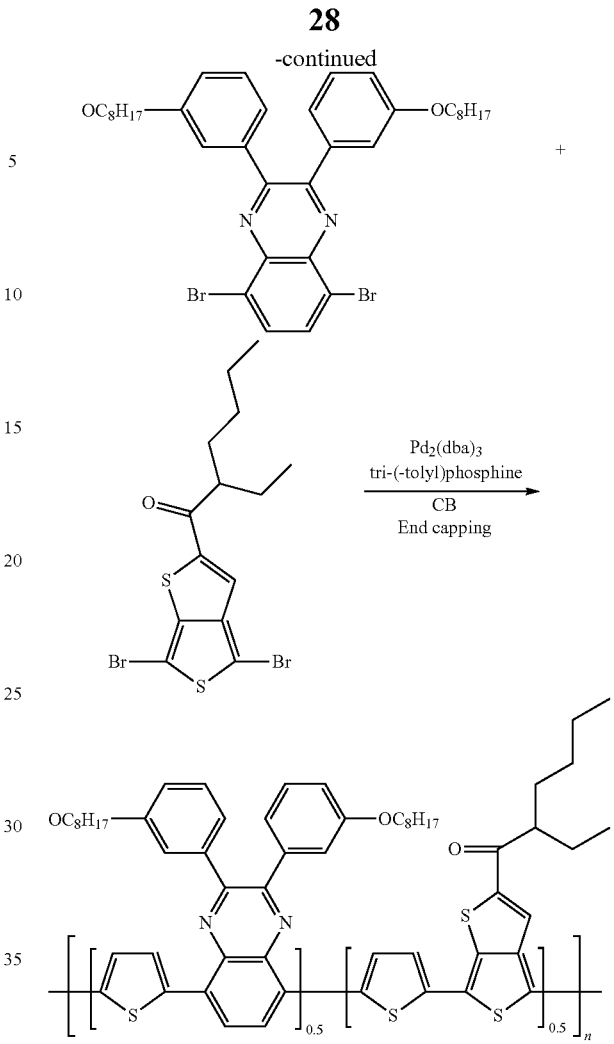

15 ml of chlorobenzene, 0.4768 g (1.0235 mmol) of 2,5-bis-trimethylstannyl-thieno[3,2-b]thiophene, 0.2817 g (0.512 mmol) of 4,7-dibromo-5,6-bis (octyloxy)benzo[c]-1,2,5-thiadiazole, 0.3565 g (0.512 mmol) of 5,8-bis(5bromothiophene-2-yl)-2,3-bis(3-(octyloxyphenyl)quinoxaline, and 35 mg of $Pd_2(PPh_3)_4$ (tetrakis(triphenylphosphine)palladium (0)) were put into a microwave reactor vial, and reacted under the condition of 170° C. for 1 hour. After the mixture was cooled to room temperature and poured into methanol, the solid was filtered and subjected to Soxhlet extraction in methanol, acetone, hexane, and chloroform, and then the chloroform portion was again precipitated in methanol to filter the solid.

Yield: 48%

Number average molecular weight: 11,600 g/mol

Weight average molecular weight: 352,000 g/mol

Figure 5:
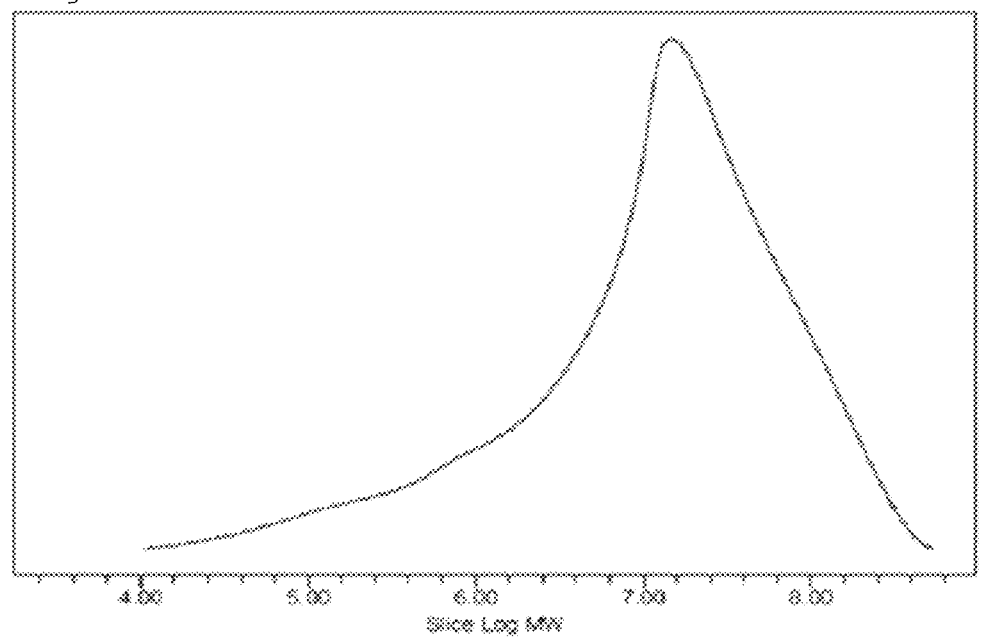
FIG. 5 is a view illustrating a gel permeation chromatography (GPC) of Copolymer 4 prepared in Example 4.

FIG. 5 is a view illustrating a gel permeation chromatography (GPC) of Copolymer 4 prepared in Example 4.

Example 5. Polymerization of Polymer (Polymerization of Copolymer 5)

13 ml of chlorobenzene, 1.2 g (2.93 mmol) of 2,5-bis(trimethylstannyl)thiophene, 1.0199 g (1.464 mmol) of 5,8-dibromo-2,3-bis(3-(octyloxy)phenyl)quinoxaline, 0.6212 g (1.464 mmol) of 1-(4,6-dibromothieno[3,4-b]thiophen-2-yl)-2-ethylhexan-1-one, 80 mg of $Pd_2(dba)_3$ (tris(dibenzylideneacetone)dipalladium(0)), and 106 mg of tri-(o-tolyl)phosphine were put into a microwave reactor vial, and reacted under the condition of 170° C. for 1 hour. After the mixture was cooled to room temperature and poured into methanol, the solid was filtered and subjected to Soxhlet extraction in methanol, acetone, hexane, and chloroform, and then the chloroform portion was again precipitated in methanol to filter the solid.

Yield: 52%

Number average molecular weight: 11,300 g/mol

Weight average molecular weight: 36,200 g/mol

Example 6. Polymerization of Polymer (Polymerization of Copolymer 6)

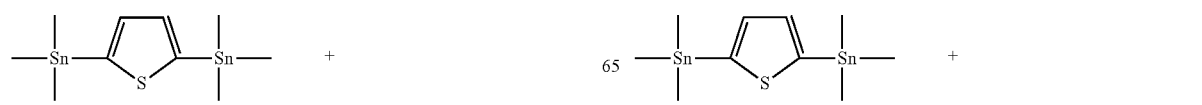

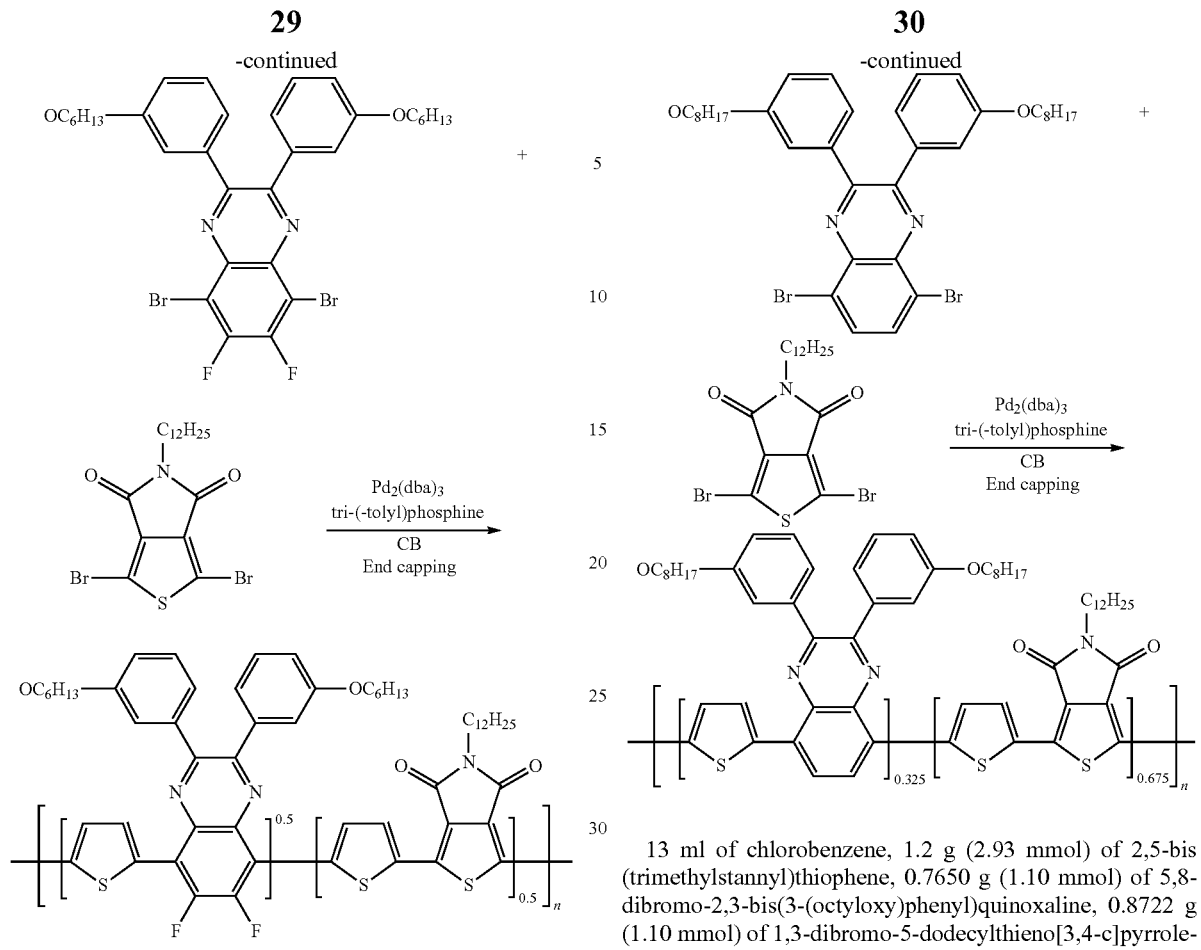

13 ml of chlorobenzene, 1.2 g (2.92 mmol) of 2,5-bis(trimethylstannyl)thiophene, 0.9905 g (1.46 mmol) of 5,8-dibromo-2,3-bis(3-(octyloxy)phenyl)quinoxaline, 0.7018 g (1.46 mmol) of 1,3-dibromo-5-dodecylthieno[3,4-c]pyrrole-4,6-dione, 80 mg of $Pd_2(dba)_3$ (tris(dibenzylideneacetone)dipalladium(0)), and 106 mg of tri-(o-tolyl)phosphine were put into a microwave reactor vial, and reacted under the condition of 170° C. for 1 hour. After the mixture was cooled to room temperature and poured into methanol, the solid was filtered and subjected to Soxhlet extraction in methanol, acetone, hexane, and chloroform, and then the chloroform portion was again precipitated in methanol to filter the solid.

Yield: 60%

Number average molecular weight: 26,300 g/mol

Weight average molecular weight: 78,300 g/mol

Figure 6:
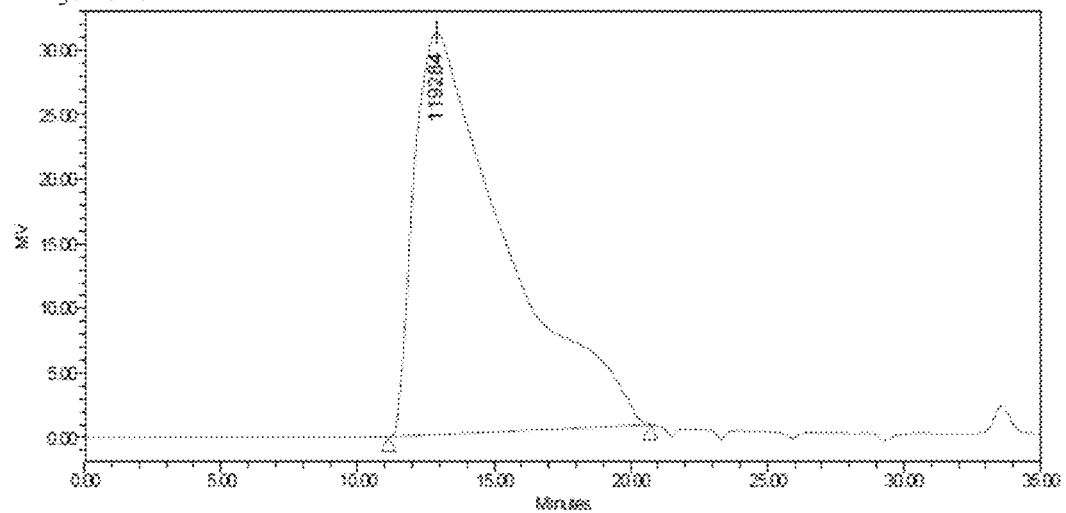
FIG. 6 is a view illustrating a gel permeation chromatography (GPC) of Copolymer 6 prepared in Example 6.

FIG. 6 is a view illustrating a gel permeation chromatography (GPC) of Copolymer 6 prepared in Example 6.

Example 7. Polymerization of Polymer (Polymerization of Copolymer 7)

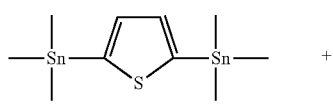

13 ml of chlorobenzene, 1.2 g (2.93 mmol) of 2,5-bis(trimethylstannyl)thiophene, 0.7650 g (1.10 mmol) of 5,8-dibromo-2,3-bis(3-(octyloxy)phenyl)quinoxaline, 0.8722 g (1.10 mmol) of 1,3-dibromo-5-dodecylthieno[3,4-c]pyrrole-4,6-dione, 80 mg of $Pd_2(dba)_3$ (tris(dibenzylideneacetone)dipalladium(0)), and 106 mg of tri-(o-tolyl)phosphine were put into a microwave reactor vial, and reacted under the condition of 170° C. for 1 hour. After the mixture was cooled to room temperature and poured into methanol, the solid was filtered and subjected to Soxhlet extraction in methanol, acetone, hexane, and chloroform, and then the chloroform portion was again precipitated in methanol to filter the solid.

Yield: 62%

Number average molecular weight: 12,300 g/mol

Weight average molecular weight: 46,700 g/mol

Figure 7:
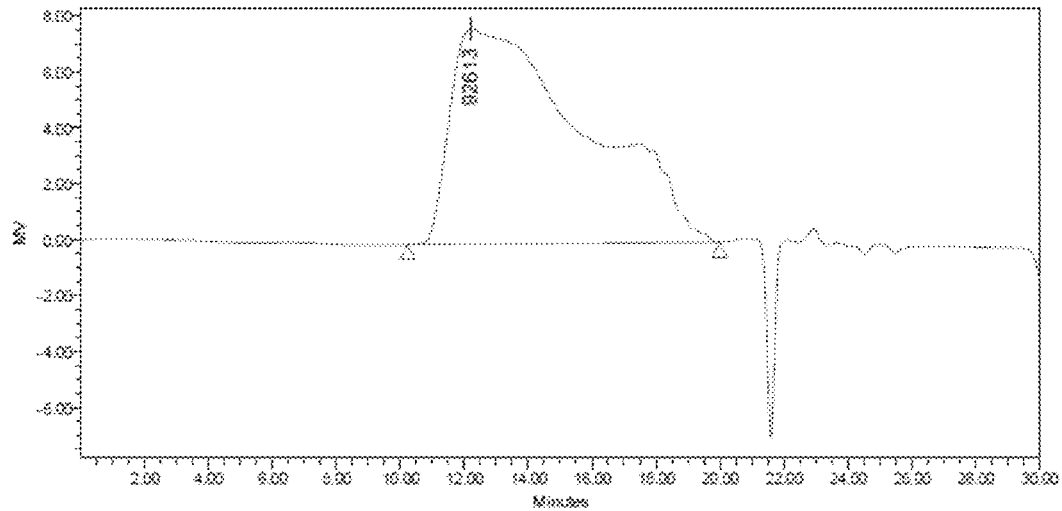
FIG. 7 is a view illustrating a gel permeation chromatography (GPC) of Copolymer 7 prepared in Example 7.

FIG. 7 is a view illustrating a gel permeation chromatography (GPC) of Copolymer 7 prepared in Example 7.

Preparation and Characteristic Measurement of Organic Solar Cell

Experimental Example 1. Preparation-1 of Organic Solar Cell

Copolymer 1 prepared in Example 1 and PC71BM were dissolved in a ratio of 1:2 in chlorobenzene (CB) to prepare a composite solution. In this case, the concentration was adjusted to 2.0 wt %, and the organic solar cell was made to have a structure of ITO/PEDOT:PSS/a photoactive layer/Al. The glass substrate on which the ITO was applied was ultrasonically cleaned by using distilled water, acetone, and 2-propanol, the ITO surface was treated with ozone for 10 min, PEDOT:PSS (baytrom P) was spin-coated to have a thickness of 45 nm, and heat treatment was performed at 120° C. for 10 minutes. For the coating of the photoactive layer, the copolymer 1-PC71BM composite solution was filtered with a 0.45 μm PP syringe filter and spin-coated, and Al was deposited thereon in a thickness of 200 nm by using a thermal evaporator under a vacuum of $3\times10^{-8}$ torr to manufacture an organic solar cell.

Experimental Example 2. Preparation-2 of Organic Solar Cell

Copolymer 2 prepared in Example 2 and PC71BM were dissolved at a ratio of 1:2 in chlorobenzene (CB) to prepare a composite solution. In this case, the concentration was adjusted to 2.0 wt %, and the organic solar cell was made to have a structure of ITO/PEDOT:PSS/a photoactive layer/Al. The glass substrate on which the ITO was applied was ultrasonically cleaned by using distilled water, acetone, and 2-propanol, the ITO surface was treated with ozone for 10 min, PEDOT:PSS (baytrom P) was spin-coated to have a thickness of 45 nm, and heat treatment was performed at 120° C. for 10 minutes. For the coating of the photoactive layer, the copolymer 2-PC71BM composite solution was filtered with a 0.45 µm PP syringe filter and spin-coated, and Al was deposited thereon to have a thickness of 200 nm by using a thermal evaporator under a vacuum of $3\times10^{-8}$ torr to manufacture an organic solar cell.

Preparation Example 3. Preparation-3 of Organic Solar Cell

Copolymer 3 prepared in Example 3 and PC71BM were dissolved at a ratio of 1:2 in chlorobenzene (CB) to prepare a composite solution. In this case, the concentration was adjusted to 2.0 wt %, and the organic solar cell was made to have a structure of ITO/PEDOT:PSS/a photoactive layer/Al. The glass substrate on which the ITO was applied was ultrasonically cleaned by using distilled water, acetone, and 2-propanol, the ITO surface was treated with ozone for 10 min, PEDOT:PSS (baytrom P) was spin-coated to have a thickness of 45 nm, and heat treatment was performed at 120° C. for 10 minutes. For the coating of the photoactive layer, the copolymer 3-PC71BM composite solution was filtered with a 0.45 µm PP syringe filter and spin-coated, and Al was deposited thereon to have a thickness of 200 nm by using a thermal evaporator under a vacuum of $3\times10^{-8}$ torr to manufacture an organic solar cell.

Preparation Example 4. Preparation-4 of Organic Solar Cell

Copolymer 4 prepared in Example 4 and PC71BM were dissolved in a ratio of 1:2 in chlorobenzene (CB) to prepare a composite solution. In this case, the concentration was adjusted to 2.0 wt %, and the organic solar cell was made to have a structure of ITO/PEDOT:PSS/a photoactive layer/Al. The glass substrate on which the ITO was applied was ultrasonically cleaned by using distilled water, acetone, and 2-propanol, the ITO surface was treated with ozone for 10 min, PEDOT:PSS (baytrom P) was spin-coated to have a thickness of 45 nm, and heat treatment was performed at 120° C. for 10 minutes. For the coating of the photoactive layer, the copolymer 4-PC71BM composite solution was filtered with a 0.45 µm PP syringe filter and spin-coated, and Al was deposited thereon to have a thickness of 200 nm by using a thermal evaporator under a vacuum of $3\times10^{-8}$ torr to manufacture an organic solar cell.

Preparation Example 5. Preparation-5 of Organic Solar Cell

Copolymer 5 prepared in Example 5 and PC71BM were dissolved at a ratio of 1:2 in chlorobenzene (CB) to prepare a composite solution. In this case, the concentration was adjusted to 2.0 wt %, and the organic solar cell was made to have a structure of ITO/PEDOT:PSS/a photoactive layer/Al. The glass substrate on which the ITO was applied was ultrasonically cleaned by using distilled water, acetone, and 2-propanol, the ITO surface was treated with ozone for 10 min, PEDOT:PSS (baytrom P) was spin-coated to have a thickness of 45 nm, and heat treatment was performed at 120° C. for 10 minutes. For the coating of the photoactive layer, the copolymer 5-PC71BM composite solution was filtered with a 0.45 µm PP syringe filter and spin-coated, and Al was deposited thereon to have a thickness of 200 nm by using a thermal evaporator under a vacuum of $3\times10^{-8}$ torr to manufacture an organic solar cell.

Preparation Example 6. Preparation-6 of Organic Solar Cell

Copolymer 6 prepared in Example 6 and PC71BM were dissolved at a ratio of 1:2 in chlorobenzene (CB) to prepare a composite solution. In this case, the concentration was adjusted to 2.0 wt %, and the organic solar cell was made to have a structure of ITO/PEDOT:PSS/a photoactive layer/Al. The glass substrate on which the ITO was applied was ultrasonically cleaned by using distilled water, acetone, and 2-propanol, the ITO surface was treated with ozone for 10 min, PEDOT:PSS (baytrom P) was spin-coated to have a thickness of 45 nm, and heat treatment was performed at 120° C. for 10 minutes. For the coating of the photoactive layer, the copolymer 6-PC71BM composite solution was filtered with a 0.45 µm PP syringe filter and spin-coated, and Al was deposited thereon to have a thickness of 200 nm by using a thermal evaporator under a vacuum of $3\times10^{-8}$ torr to manufacture an organic solar cell.

Preparation Example 7. Preparation-7 of Organic Solar Cell

Copolymer 7 prepared in Example 7 and PC71BM were dissolved at a ratio of 1:2 in chlorobenzene (CB) to prepare a composite solution. In this case, the concentration was adjusted to 2.0 wt %, and the organic solar cell was made to have a structure of ITO/PEDOT:PSS/a photoactive layer/Al. The glass substrate on which the ITO was applied was ultrasonically cleaned by using distilled water, acetone, and 2-propanol, the ITO surface was treated with ozone for 10 min, PEDOT:PSS (baytrom P) was spin-coated to have a thickness of 45 nm, and heat treatment was performed at 120° C. for 10 minutes. For the coating of the photoactive layer, the copolymer 7-PC71BM composite solution was filtered with a 0.45 µm PP syringe filter and spin-coated, and Al was deposited thereon to have a thickness of 200 nm by using a thermal evaporator under a vacuum of $3\times10^{-8}$ torr to manufacture an organic solar cell.

Test Example 1

The photoelectric transformation characteristics of the organic solar cells manufactured in Preparation Examples 1 to 4 and Comparative Example 1 were measured under the condition of 100 mW/cm2 (AM 1.5), and the results are shown in the following Table 1.

TABLE 1

| Active layer | $V_{oc}$ (V) | $J_{sc}$ (mA/cm$^2$) | FF | PCE (%) |
|---|---|---|---|---|
| Preparation Example 1 | Copolymer 1/PC$_{71}$BM = 1:2 | 0.83 | 12.32 | 61.4 | 6.24 |
| Preparation Example 2 | Copolymer 2/PC$_{71}$BM = 1:2 | 0.835 | 8.17 | 50.0 | 3.41 |
| Preparation Example 3 | Copolymer 3/PC$_{71}$BM = 1:2 | 0.504 | 4.77 | 63.7 | 1.53 |
| Preparation Example 4 | Copolymer 4/PC$_{71}$BM = 1:2 | 0.69 | 7.67 | 66.0 | 3.48 |
| Preparation Example 5 | Copolymer 5/PC$_{71}$BM = 1:2 | 0.91 | 6.14 | 57.2 | 3.18 |
| Preparation Example 6 | Copolymer 6/PC$_{71}$BM = 1:2 | 0.84 | 9.62 | 59.1 | 4.75 |
| Preparation Example 7 | Copolymer 7/PC$_{71}$BM = 1:2 | 0.87 | 8.04 | 48.9 | 3.41 |
| Comparative Example 1 | P3HT/PC$_{71}$BM = 1:1 | 0.65 | 10.10 | 59.2 | 3.88 |

In Table 1, the total thickness means the thickness of the active layer in the organic solar cell, Voc means an open-circuit voltage, Jsc means a short-circuit current, FF means a fill factor, and PCE means an energy conversion efficiency. The open-circuit voltage and the short-circuit current are the intercept of the X-axis and the Y-axis in the fourth quadrant of the voltage-current density curve, respectively, and when the two values becomes high, the efficiency of the solar cell is desirably increased. Furthermore, the fill factor is a value obtained by dividing the area of a rectangle which may be drawn inside the curve by the product of the short-circuit current and the open-circuit voltage. When the three values are divided by the intensity of light irradiated, the energy conversion efficiency may be obtained, and the higher value is preferred.

Figure 8:
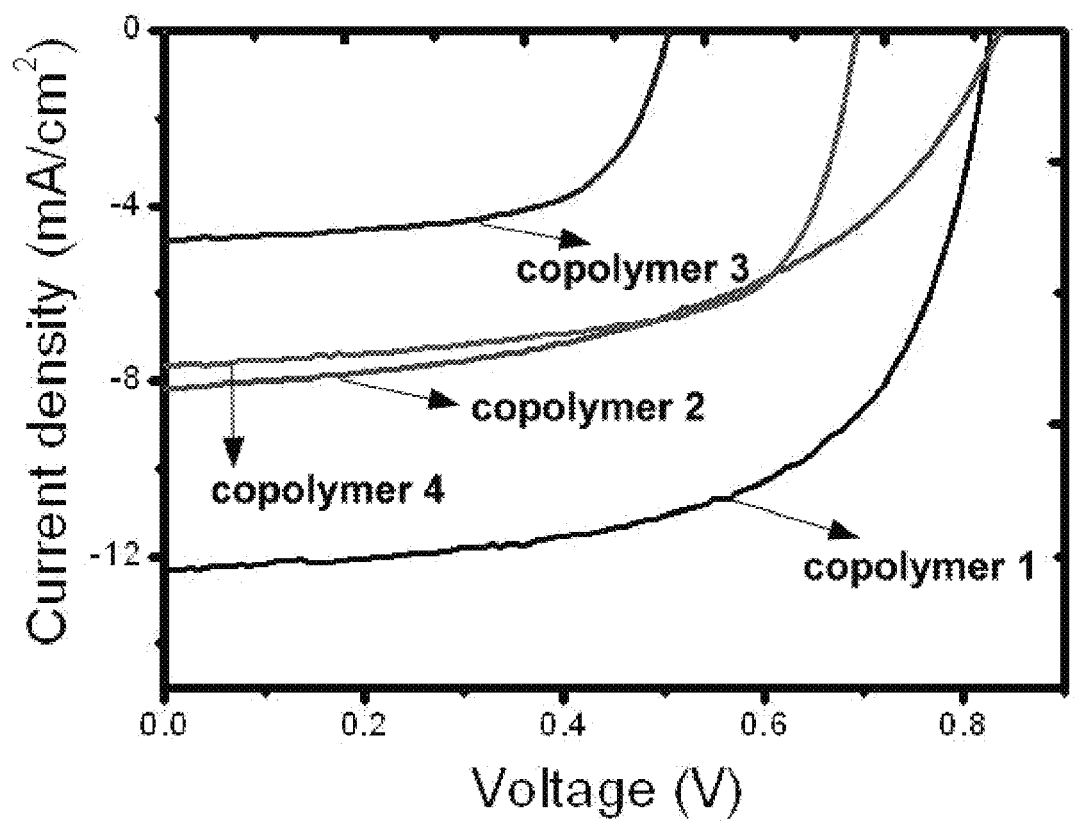
FIG. 8 is a view illustrating the current-voltage curves of organic solar cells of Examples 1 to 4 of the present specification.

FIG. 8 is a view illustrating a current-voltage curve of organic solar cells of Preparation Examples 1 to 4 of the present specification.

Figure 9:
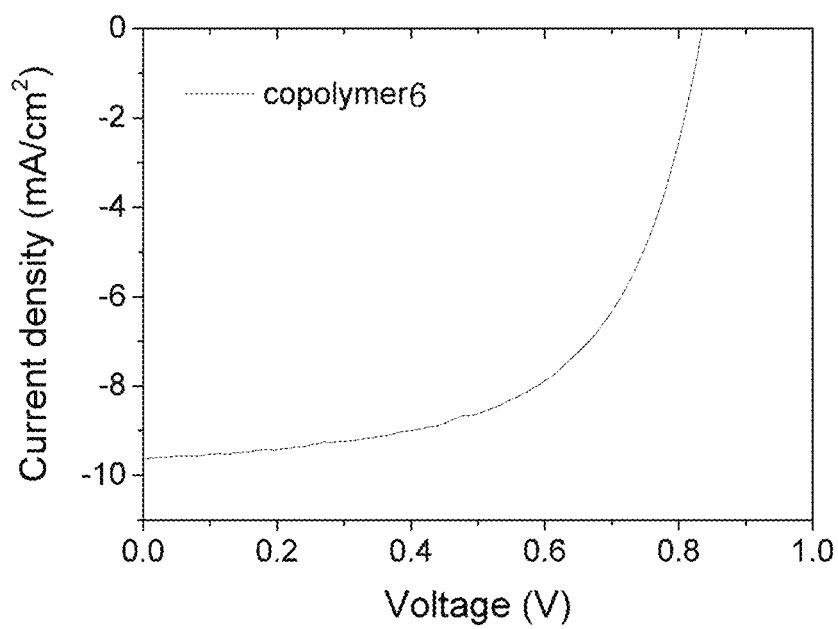
FIG. 9 is a view illustrating a current-voltage curve of an organic solar cell of Preparation Example 6 of the present specification.

FIG. 9 is a view illustrating a current-voltage curve of an organic solar cell of Preparation Example 6 of the present specification.

The invention claimed is:

1. A copolymer comprising:
a first monomer represented by the following Formula 1;
a second monomer that acts as an electron donor; and
a third monomer that acts as an electron acceptor:
wherein the copolymer is a random copolymer,

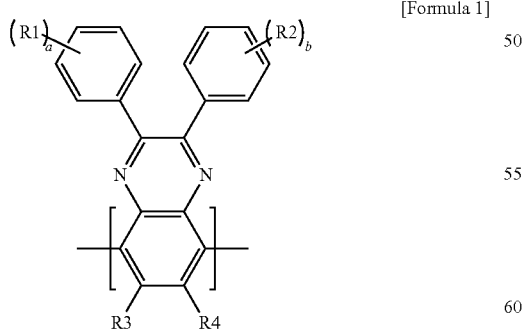

[Formula 1]

in Formula 1,
a and b are each an integer of 1 to 5,
R1 is the same or different when a is an integer of 2 to 5,
R2 is the same or different when b is an integer of 2 to 5, and R1 to R4 are the same as or different from each other, and are each independently selected from the group consisting of hydrogen; deuterium; a halogen group; a nitrile group; a nitro group; an imide group; an amide group; a hydroxyl group; a substituted or unsubstituted carbonyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group, wherein the electron donor comprises at least one of the following Formulae:

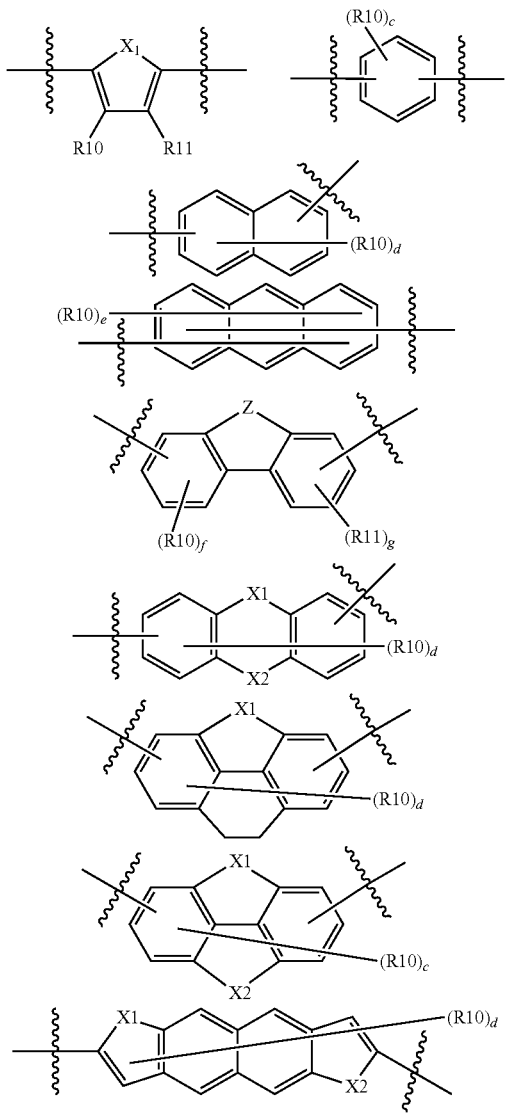

-continued

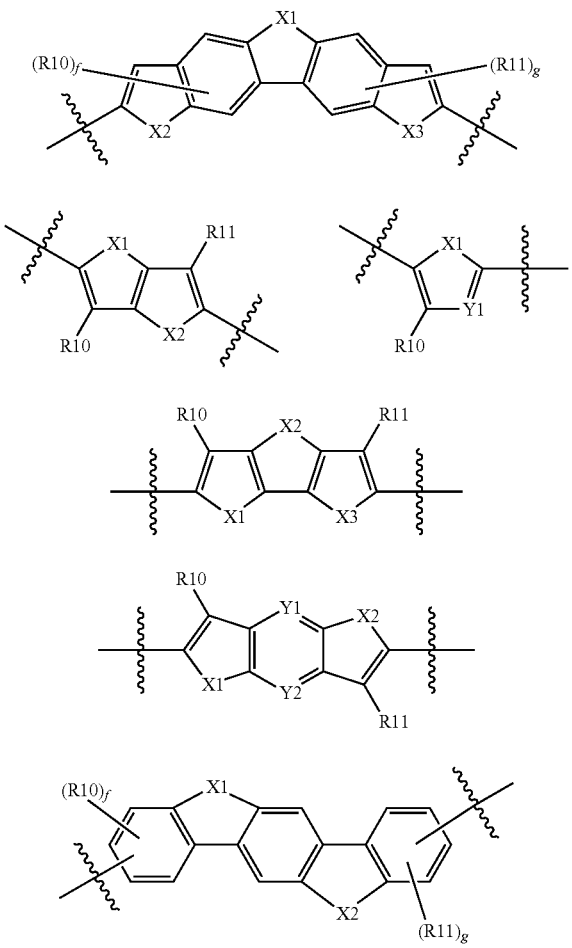

in the Formulae,
c is an integer of 1 to 4,
d is an integer of 1 to 6,
e is an integer in the range of 1 to 8,
f and g are each an integer of 1 to 3,
R10 is the same or different when c, d, e, and f are 2 or more,
R11 is the same or different when g is 2 or more,
R10 and R11 are the same as or different from each other, and are each independently selected from the group consisting of hydrogen; deuterium; a halogen group; a nitrile group; a nitro group; an imide group; an amide group; a hydroxyl group; a substituted or unsubstituted carbonyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group, X1 to X3 are the same as or different from each other, and are each independently selected from the group consisting of CRR', NR, O, SiRR', PR, S, GeRR', Se, and Te, Z is selected from the group consisting of CRR', O, SiRR', PR, S, GeRR', Se, and Te, Y1 and Y2 are the same as or different from each other, and are each independently selected from the group consisting of CR, N, SiR, P, and GeR, and R and R' are the same as or different from each other, and are each independently selected from the group consisting of hydrogen; deuterium; a halogen group; a nitrile group; a nitro group; an imide group; an amide group; a hydroxyl group; a substituted or unsubstituted carbonyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group, wherein the electron acceptor comprises at least one of the following Formulae:

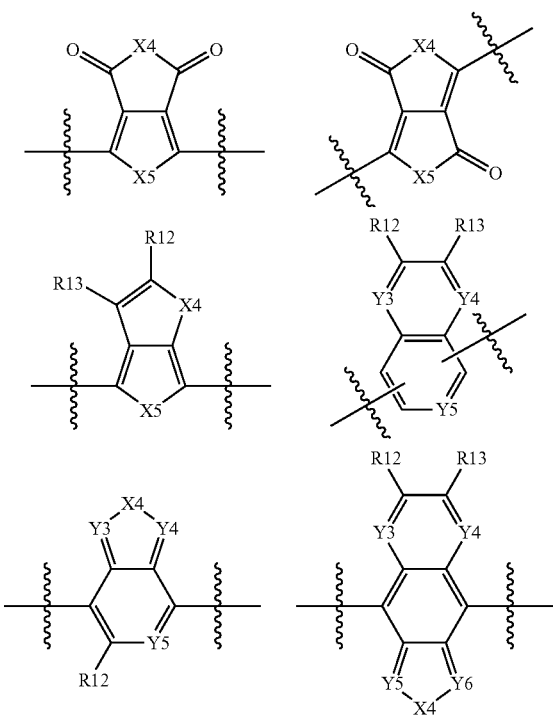

-continued

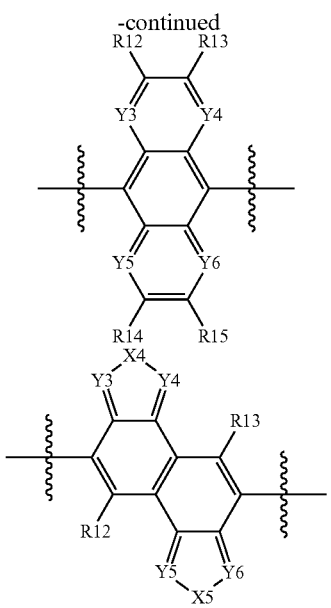

in the Formulae,

R12 is selected from the group consisting of a hydroxyl group; a substituted or unsubstituted carbonyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkenyl group; a substituted or unsubstituted aryl group; and a substituted or unsubstituted heterocyclic group, R13 to R15 are the same as or different from each other, and are each independently selected from the group consisting of hydrogen; deuterium; a halogen group; a nitrile group; a nitro group; an imide group; an amide group; a hydroxyl group; a substituted or unsubstituted carbonyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group, X4 and X5 are the same as or different from each other, and are each independently selected from the group consisting of CRR', NR, O, SiRR', PR, S, GeRR', Se, and Te, Y3 to Y6 are the same as or different from each other, and are each independently selected from the group consisting of CR, N, SiR, P, and GeR, and R and R' are the same as or different from each other, and are each independently selected from the group consisting of hydrogen; deuterium; a halogen group; a nitrile group; a nitro group; an imide group; an amide group; a hydroxyl group; a substituted or unsubstituted carbonyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group.

2. The copolymer of claim 1, wherein R1 and R2 are the same as or different from each other, and are each independently a substituted or unsubstituted alkoxy group; or a substituted or unsubstituted alkyl group.

3. The copolymer of claim 1, wherein the first monomer represented by Formula 1 is represented by the following Formula 2:

[Formula 2]

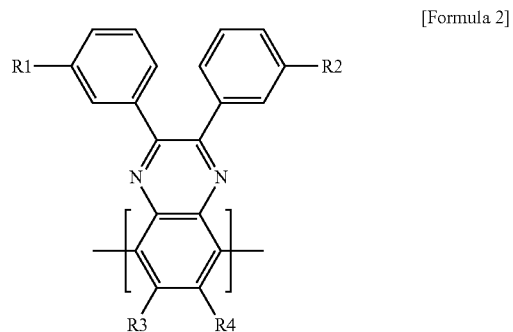

in Formula 2,

R1 to R4 are the same as those defined in Formula 1.

4. The copolymer of claim 1, wherein the copolymer comprises a unit represented by the following Formula 3:

[Formula 3]

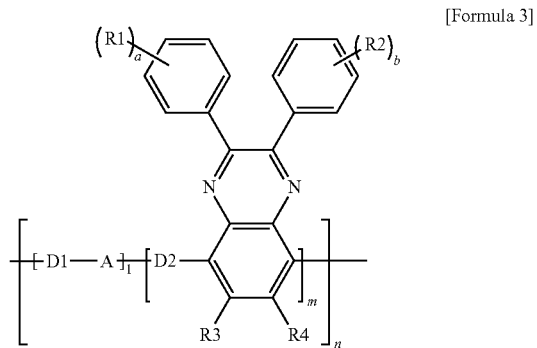

in Formula 3, a, b, and R1 to R4 are the same as those defined in Formula 1, l is a real number, which is $0 \leq l \leq 1$ as a mole fraction, m is a real number, which is $0 \leq m \leq 1$ as a mole fraction, and l+m=1, n is an integer of 1 to 10,000, D1 and D2 are the same as or different from each other, and are each independently a second unit that acts as an electron donor, and A is a third unit that acts as an electron acceptor.

5. The copolymer of claim 1, wherein the copolymer comprises at least one of units represented by the following Formulae 4 to 7:

in Formulae 4 to 7, a, b, and R1 to R4 are the same as those defined in Formula 1, l is a real number, which is $0 \leq l \leq 1$ as a mole fraction, m is a real number, which is $0 \leq m \leq 1$ as a mole fraction, and l+m=1, h and i are an integer of 1 to 3 as a repeating unit of a structure in a parenthesis,

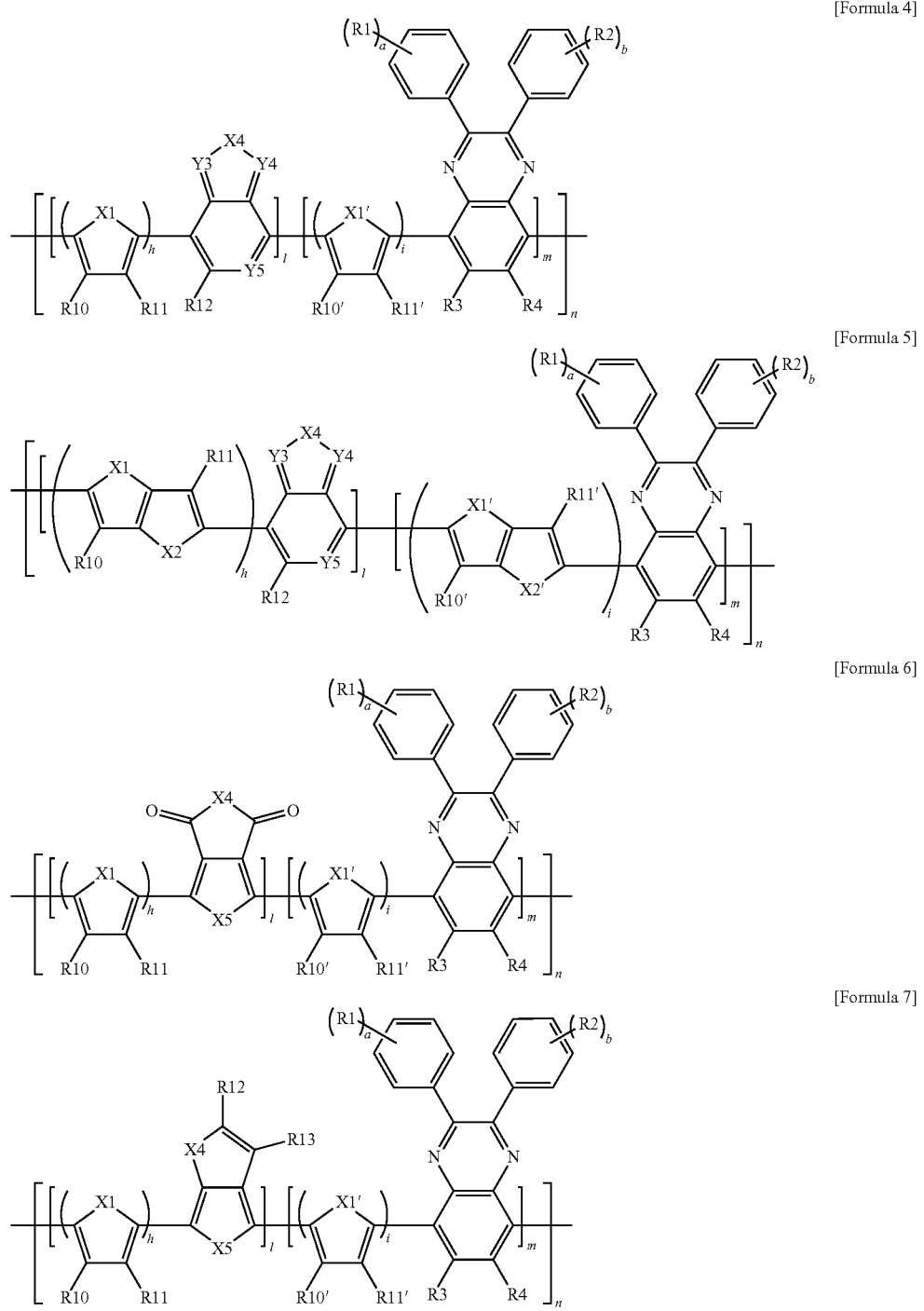

[Formula 4]

[Formula 5]

[Formula 6]

[Formula 7]

the structures in the parenthesis are the same as or different from each other when h and i are 2 or more, n is an integer of 1 to 10,000, R10, R11, R13, R10', and R11' are the same as or different from each other, and are each independently selected from the group consisting of hydrogen; deuterium; a halogen group; a nitrile group; a nitro group; an imide group; an amide group; a hydroxyl group; a substituted or unsubstituted carbonyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group, R12 is selected from the group consisting of a hydroxyl group; a substituted or unsubstituted carbonyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkenyl group; a substituted or unsubstituted aryl group; and a substituted or unsubstituted heterocyclic group, X1, X1', X2, X2', X4, and X5 are the same as or different from each other, and are each independently selected from the group consisting of CRR', NR, O, SiRR', PR, S, GeRR', Se, and Te, Y3 to Y5 are the same as or different from each other, and are each independently selected from the group consisting of CR, N, SiR, P, and GeR, and R and R' are the same as or different from each other, and are each independently selected from the group consisting of hydrogen; deuterium; a halogen group; a nitrile group; a nitro group; an imide group; an amide group; a hydroxyl group; a substituted or unsubstituted carbonyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group.

6. The copolymer of claim 1, wherein a number average molecular weight of the copolymer is 500 g/mol to 1,000,000 g/mol.

7. The copolymer of claim 1, wherein a molecular weight distribution of the copolymer is 1 to 100.

8. An organic solar cell comprising:
a first electrode;
a second electrode provided opposite to the first electrode; and
an organic material layer having one or more layers disposed between the first electrode and the second electrode and comprising a photoactive layer,
wherein one or more layers of the organic material layer comprise the copolymer of claim 1.

9. The organic solar cell of claim 8, wherein the organic material layer comprises a hole transport layer, a hole injection layer, or a layer which transports and injects holes simultaneously, and the hole transport layer, the hole injection layer, or the layer which transports and injects holes simultaneously comprises the copolymer.

10. The organic solar cell of claim 8, wherein the organic material layer comprises an electron transport layer, an electron injection layer, or a layer which transports and injects electrons simultaneously, and the electron transport layer, the electron injection layer, or the layer which transports and injects electrons simultaneously comprises the copolymer.

11. The organic solar cell of claim 8, wherein the photoactive layer comprises one or two or more selected from the group consisting of an electron donor and an electron acceptor, and the electron donor comprises the copolymer.

12. The organic solar cell of claim 11, wherein the electron acceptor is selected from the group consisting of fullerene, a fullerene derivative, carbon nanotube, a carbon nanotube derivative, bathocuproine, a semiconductor element, a semiconductor compound, and a combination thereof.

13. The organic solar cell of claim 11, wherein the electron donor and the electron acceptor are a bulk heterojunction (BHJ).

14. The organic solar cell of claim 8, wherein the photoactive layer has a bilayer structure comprising an n-type organic material layer and a p-type organic material layer, and the p-type organic material layer comprises the copolymer.

* * * * *